US009658783B2

United States Patent
Muraoka et al.

(10) Patent No.: US 9,658,783 B2
(45) Date of Patent: May 23, 2017

(54) DRAM HAVING SDRAM INTERFACE AND FLASH MEMORY CONSOLIDATED MEMORY MODULE

(71) Applicant: Hitachi, Ltd., Chiyoda-ku, Tokyo (JP)

(72) Inventors: Satoshi Muraoka, Tokyo (JP); Yutaka Uematsu, Tokyo (JP); Hideki Osaka, Tokyo (JP); Yuusuke Fukumura, Tokyo (JP); Satoru Watanabe, Tokyo (JP); Masabumi Shibata, Tokyo (JP); Hiroshi Kakita, Tokyo (JP); Yuichi Fukuda, Tokyo (JP); Takashi Miyagawa, Tokyo (JP); Michinori Naito, Tokyo (JP); Hitoshi Ueno, Tokyo (JP); Akio Idei, Tokyo (JP); Takayuki Ono, Tokyo (JP); Taishi Sumikura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/759,504

(22) PCT Filed: Mar. 27, 2013

(86) PCT No.: PCT/JP2013/059154
§ 371 (c)(1),
(2) Date: Jul. 7, 2015

(87) PCT Pub. No.: WO2014/155592
PCT Pub. Date: Oct. 2, 2014

(65) Prior Publication Data
US 2015/0347032 A1 Dec. 3, 2015

(51) Int. Cl.
G11C 5/04 (2006.01)
G11C 7/10 (2006.01)
(Continued)

(52) U.S. Cl.
CPC .......... G06F 3/0611 (2013.01); G06F 3/0659 (2013.01); G06F 3/0683 (2013.01);
(Continued)

(58) Field of Classification Search
CPC . G11C 5/04; G11C 7/10; G06F 3/0611; G06F 3/0659; G06F 3/0683; G06F 13/1694
See application file for complete search history.

(56) References Cited

U.S. PATENT DOCUMENTS 8,930,647 B1 * 1/2015 Smith ................. G06F 9/44557
711/103
2002/0185337 A1 12/2002 Miura et al.
(Continued)

FOREIGN PATENT DOCUMENTS

CN 101473438 A 7/2009
JP 2002-366429 A 12/2002
(Continued)

*Primary Examiner* — Aracelis Ruiz
(74) *Attorney, Agent, or Firm* — Miles & Stockbridge P.C.

(57) ABSTRACT

In methods connecting a memory module configured from DRAM, which is high-speed memory, and a memory module configured from flash memory which is slower than DRAM but is high-capacity memory, to a CPU memory bus, in the case of sequential reading, the busy rate of the CPU memory bus increases, and performance degradation occurs easily. In the present invention, an information processing device has a CPU, a CPU memory bus, and a primary storage device. The primary storage device has a first memory module and a second memory module. The first memory module has high-speed memory. The second memory module has memory having the same memory interface as that of the high-speed memory, high-capacity memory having a different memory interface from that of the high-speed memory, and a controller that controls same. The
(Continued)

first memory module and second memory module are caused to be accessed by the memory interface of the high-speed memory.

14 Claims, 19 Drawing Sheets

(51) Int. Cl.
   *G06F 3/06* (2006.01)
   *G06F 13/16* (2006.01)
(52) U.S. Cl.
   CPC ............ *G06F 13/1694* (2013.01); *G11C 5/04* (2013.01); *G11C 7/10* (2013.01)

(56) References Cited

U.S. PATENT DOCUMENTS

2006/0294295 A1* 12/2006 Fukuzo ............... G06F 13/1673
                                                              711/105
2007/0288683 A1    12/2007 Panabaker et al.
2010/0115191 A1     5/2010 Hampel et al.

FOREIGN PATENT DOCUMENTS

| JP | 2009-540431 A | 11/2009 |
| JP | 2010-524059 A | 7/2010 |
| WO | WO 2007/145883 A1 | 12/2007 |
| WO | WO 2008/121559 A1 | 10/2008 |

* cited by examiner

F I G. 1
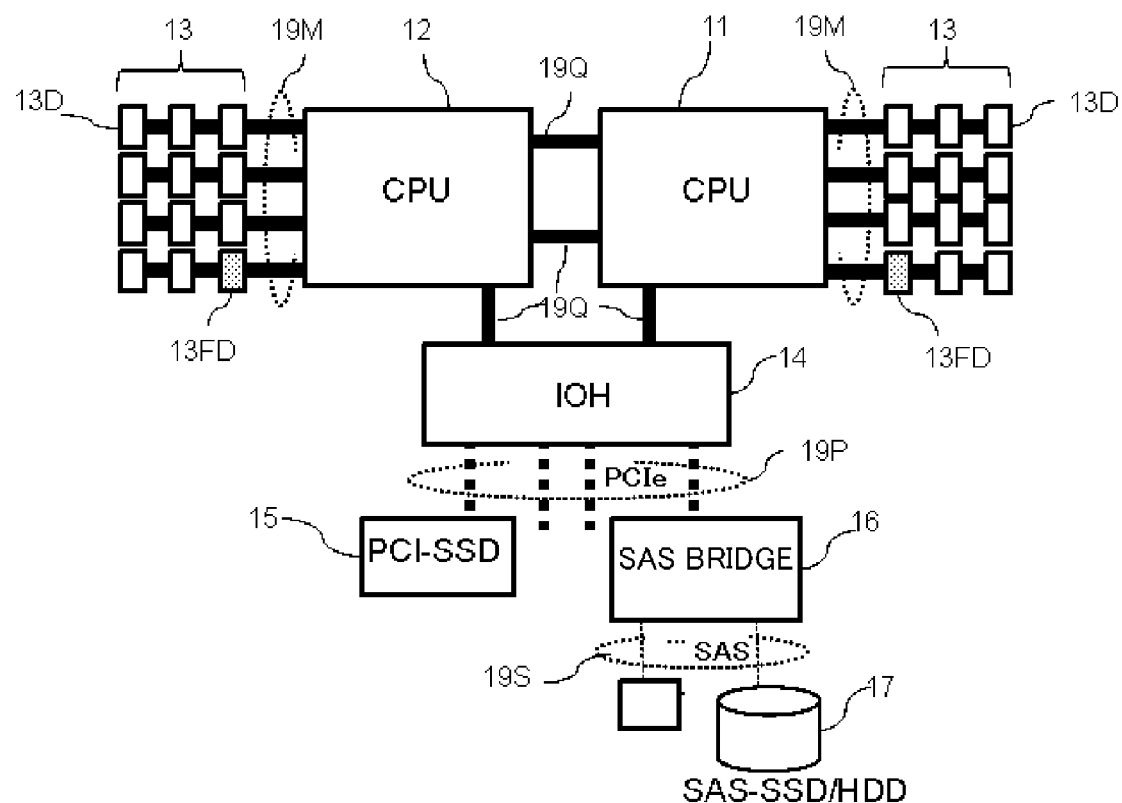

F I G. 2A
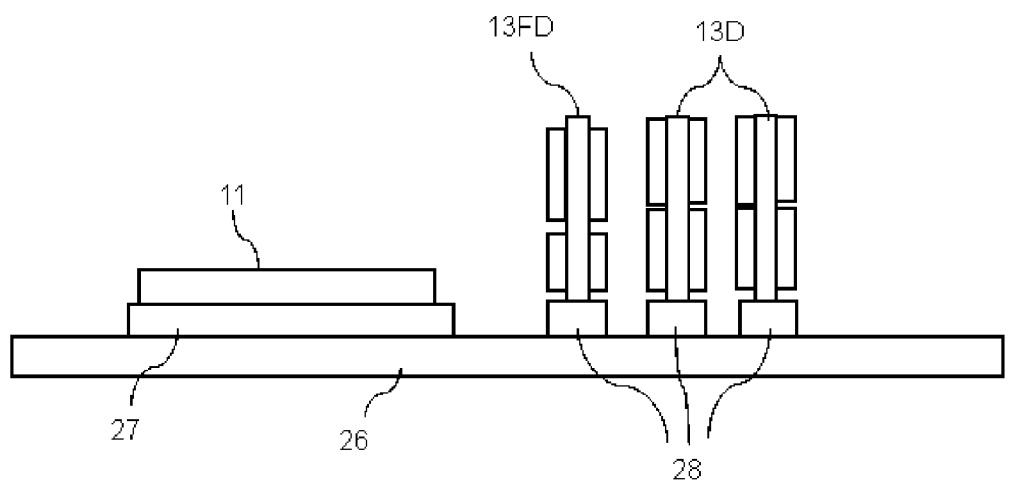
F I G. 2B
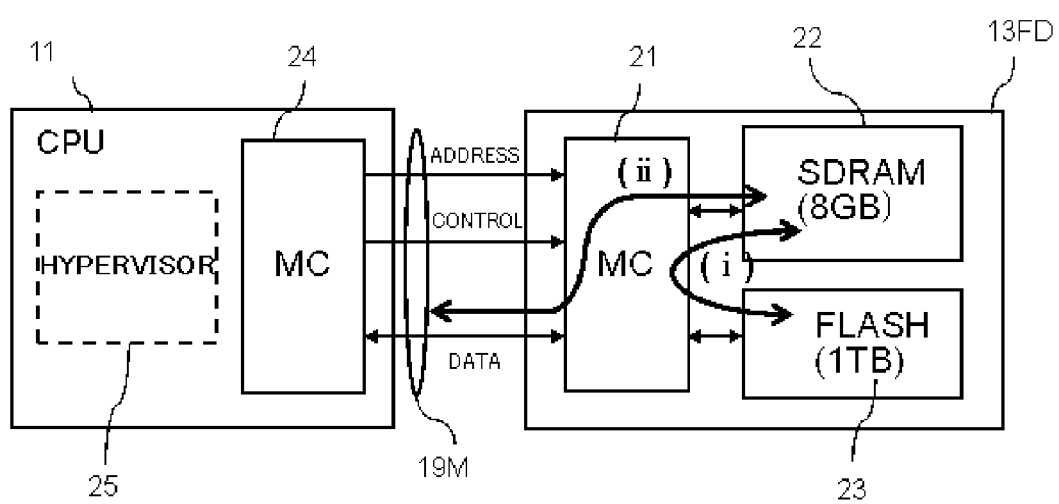

F I G. 3A
(a)
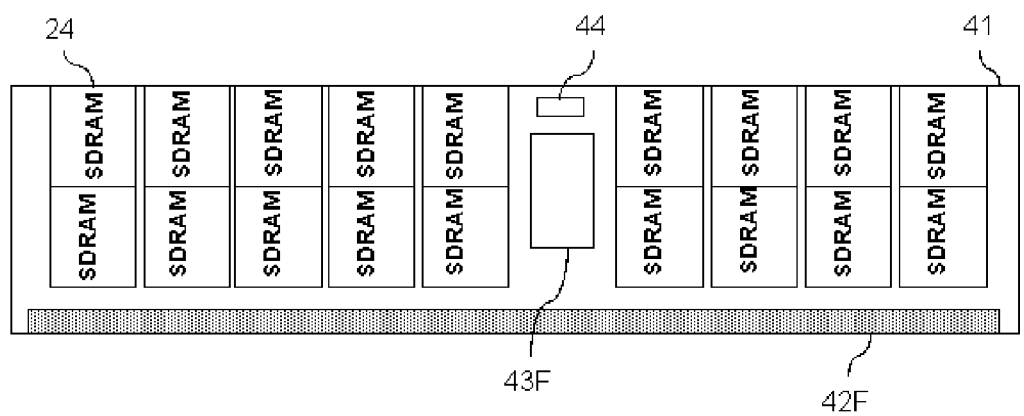
(b)
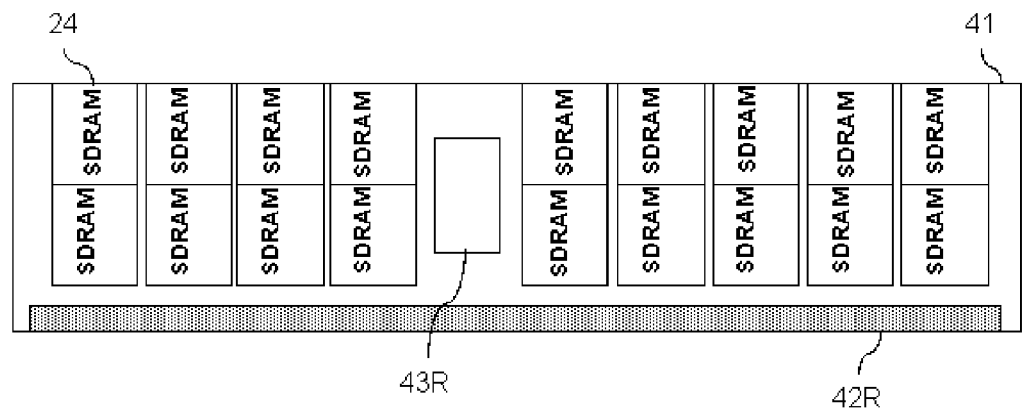

F I G. 3B

| TERMINAL | CODE | TERMINAL | CODE | TERMINAL | CODE | TERMINAL | CODE |
|---|---|---|---|---|---|---|---|
| 1 | VREFDQ | 31 | DQ25 | 61 | A2 | 91 | DQ41 |
| 2 | VSS | 32 | VSS | 62 | VDD | 92 | VSS |
| 3 | DQ0 | 33 | DQS3# | 63 | NF | 93 | DQS5# |
| 4 | DQ1 | 34 | DQS3 | 64 | NF | 94 | DQS5 |
| 5 | VSS | 35 | VSS | 65 | VDD | 95 | VSS |
| 6 | DQS0# | 36 | DQ26 | 66 | VDD | 96 | DQ42 |
| 7 | DQS0 | 37 | DQ27 | 67 | VREFCA | 97 | DQ43 |
| 8 | VSS | 38 | VSS | 68 | Par_IN | 98 | VSS |
| 9 | DQ2 | 39 | CB0 | 69 | VDD | 99 | DQ48 |
| 10 | DQ3 | 40 | CB1 | 70 | A10 | 100 | DQ49 |
| 11 | VSS | 41 | VSS | 71 | BA0 | 101 | VSS |
| 12 | DQ8 | 42 | DQS8# | 72 | VDD | 102 | DQS6# |
| 13 | DQ9 | 43 | DQS8 | 73 | WE# | 103 | DQS6 |
| 14 | VSS | 44 | VSS | 74 | CAS# | 104 | VSS |
| 15 | DQS1# | 45 | CB2 | 75 | VDD | 105 | DQ50 |
| 16 | DQS1 | 46 | CB3 | 76 | S1# | 106 | DQ51 |
| 17 | VSS | 47 | VSS | 77 | ODT1 | 107 | VSS |
| 18 | DQ10 | 48 | VTT | 78 | VDD | 108 | DQ56 |
| 19 | DQ11 | 49 | VTT | 79 | S2# | 109 | DQ57 |
| 20 | VSS | 50 | CKE0 | 80 | VSS | 110 | VSS |
| 21 | DQ16 | 51 | VDD | 81 | DQ32 | 111 | DQS7# |
| 22 | DQ17 | 52 | BA2 | 82 | DQ33 | 112 | DQS7 |
| 23 | VSS | 53 | Err_Out# | 83 | VSS | 113 | VSS |
| 24 | DQS2# | 54 | VDD | 84 | DQS4# | 114 | DQ58 |
| 25 | DQS2 | 55 | A11 | 85 | DQS4 | 115 | DQ59 |
| 26 | VSS | 56 | A7 | 86 | VSS | 116 | VSS |
| 27 | DQ18 | 57 | VDD | 87 | DQ34 | 117 | SA0 |
| 28 | DQ19 | 58 | A5 | 88 | DQ35 | 118 | SCL |
| 29 | VSS | 59 | A4 | 89 | VSS | 119 | SA2 |
| 30 | DQ24 | 60 | VDD | 90 | DQ40 | 120 | VTT |

F I G. 3C

| TERMINAL | CODE | TERMINAL | CODE | TERMINAL | CODE | TERMINAL | CODE |
|---|---|---|---|---|---|---|---|
| 121 | VSS | 151 | VSS | 181 | A1 | 211 | VSS |
| 122 | DQ4 | 152 | DQS12 | 182 | VDD | 212 | DQS14 |
| 123 | DQ5 | 153 | DQS12# | 183 | VDD | 213 | DQS14# |
| 124 | VSS | 154 | VSS | 184 | CK0 | 214 | VSS |
| 125 | DQS9 | 155 | DQ30 | 185 | CK0# | 215 | DQ46 |
| 126 | DQS9# | 156 | DQ31 | 186 | VDD | 216 | DQ47 |
| 127 | VSS | 157 | VSS | 187 | EVENT# | 217 | VSS |
| 128 | DQ6 | 158 | CB4 | 188 | A0 | 218 | DQ52 |
| 129 | DQ7 | 159 | CB5 | 189 | VDD | 219 | DQ53 |
| 130 | VSS | 160 | VSS | 190 | BA1 | 220 | VSS |
| 131 | DQ12 | 161 | DQS17 | 191 | VDD | 221 | DQS15 |
| 132 | DQ13 | 162 | DQS17# | 192 | RAS# | 222 | DQS15# |
| 133 | VSS | 163 | VSS | 193 | S0# | 223 | VSS |
| 134 | DQS10 | 164 | CB6 | 194 | VDD | 224 | DQ54 |
| 135 | DQS10# | 165 | CB7 | 195 | ODT0 | 225 | DQ55 |
| 136 | VSS | 166 | VSS | 196 | A13 | 226 | VSS |
| 137 | DQ14 | 167 | NC | 197 | VDD | 227 | DQ60 |
| 138 | DQ15 | 168 | RESET# | 198 | S3# | 228 | DQ61 |
| 139 | VSS | 169 | CKE1 | 199 | VSS | 229 | VSS |
| 140 | DQ20 | 170 | VDD | 200 | DQ36 | 230 | DQS16 |
| 141 | DQ21 | 171 | A15 | 201 | DQ37 | 231 | DQS16# |
| 142 | VSS | 172 | A14 | 202 | VSS | 232 | VSS |
| 143 | DQS11 | 173 | VDD | 203 | DQS13 | 233 | DQ62 |
| 144 | DQS11# | 174 | A12 | 204 | DQS13# | 234 | DQ63 |
| 145 | VSS | 175 | A9 | 205 | VSS | 235 | VSS |
| 146 | DQ22 | 176 | VDD | 206 | DQ38 | 236 | VDDSPD |
| 147 | DQ23 | 177 | A8 | 207 | DQ39 | 237 | SA1 |
| 148 | VSS | 178 | A6 | 208 | VSS | 238 | SDA |
| 149 | DQ28 | 179 | VDD | 209 | DQ44 | 239 | VSS |
| 150 | DQ29 | 180 | A3 | 210 | DQ45 | 240 | VTT |

F I G. 3D

| CODE | FUNCTION | PATTERN |
|---|---|---|
| Ax | Address Inputs | Input |
| BAx | Bank Address Inputs | Input |
| CKx, CKx# | Clock | Input |
| CKEx | Clock Enable | Input |
| DMx | Data Mask | Input |
| ODTx | On Die Termination | Input |
| Par_In | Parity Input | Input |
| RAS#, CAS#, WE# | Command Inputs | Input |
| RESET# | Active Low Asynchronous Reset | Input |
| Sx# | Chip Select | Input |
| SAx | Serial Address Inputs | Input |
| SCL | Serial Clock for temperature sensor/SPD EEPROM | Input |
| CBx | Check Bits | Input/Output |
| DQx | Data Input/Output | Input/Output |
| DQSx, DQSx# | Data Strobe | Input/Output |
| SDA | Serial Data | Input/Output |
| TDQSx,TDQSx# | Redundant Data Strobe | Output |
| Err_OUT# | Parity Error Output | Output |
| EVENT# | Temperature Event | Output |
| VDD | Power Supply | Supply Voltage |
| VDDSPD | Temperature Sensor/SPD EEPROM Power Supply | Supply Voltage |
| VREFCA | Reference voltage for CA | Supply Voltage |
| VREFDQ | Reference voltage for DQ | Supply Voltage |
| VSS | Ground | Supply Voltage |
| VTT | Temperature Voltage | Supply Voltage |
| NC | No Connect | — |
| NF | No Function | — |

F I G. 7
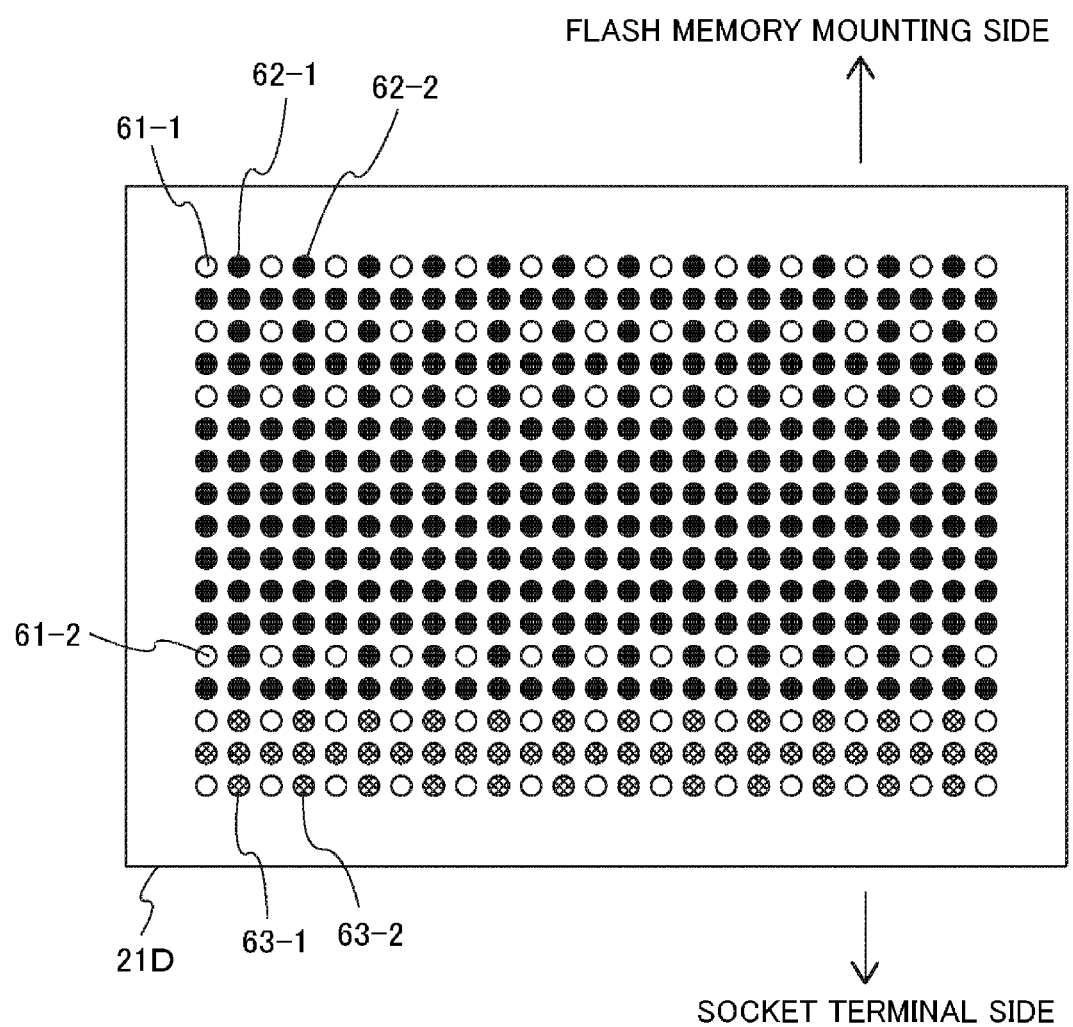

FIG. 8A

|   | 1 | 2 | 3 | 4 | 5 | 6 | 7 | 8 | 9 |
|---|---|---|---|---|---|---|---|---|---|
| A | $V_{SS}$ | $V_{DD}$ | NC | | | | NF/TDQS# | $V_{SS}$ | $V_{DD}$ |
| B | $V_{SS}$ | $V_{SSQ}$ | DQ0 | | | | DM/TDQS | $V_{SSQ}$ | $V_{DDQ}$ |
| C | $V_{DDQ}$ | DQ2 | DQS | | | | DQ1 | DQ3 | $V_{SSQ}$ |
| D | $V_{SSQ}$ | DQ6 | DQS# | | | | $V_{DD}$ | $V_{SS}$ | $V_{SSQ}$ |
| E | $V_{REFDQ}$ | $V_{DDQ}$ | DQ4 | | | | DQ7 | DQ5 | $V_{DDQ}$ |
| F | ODT1 | $V_{SS}$ | RAS# | | | | CK | $V_{SS}$ | CKE1 |
| G | ODT0 | $V_{DD}$ | CAS# | | | | CK# | $V_{DD}$ | CKE0 |
| H | CS1# | CS0# | WE# | | | | A10/AP | ZQ0 | ZQ1 |
| J | $V_{SS}$ | BA0 | BA2 | | | | A15 | $V_{REFCA}$ | $V_{SS}$ |
| K | $V_{DD}$ | A3 | A0 | | | | A12/BC# | BA1 | $V_{DD}$ |
| L | $V_{SS}$ | A5 | A2 | | | | A1 | A4 | $V_{SS}$ |
| M | $V_{DD}$ | A7 | A9 | | | | A11 | A6 | $V_{DD}$ |
| N | $V_{SS}$ | RESET# | A13 | | | | A14 | A8 | $V_{SS}$ |

F I G. 8B

| CODE | FUNCTION | PATTERN | CONNECTED CNT |
|---|---|---|---|
| CK, CK# | Clock | Input | MCA |
| CKE | Clock Enable | Input | MCA |
| CS# | Chip Select | Input | MCA |
| RAS#, CAS#, WE# | Command Inputs | Input | MCA |
| BA[2:0] | Bank Address Inputs | Input | MCA |
| A10(AP) | Auto-Precharge | Input | MCA |
| A[15:0] | Address Inputs | Input | MCA |
| A12(/BC) | Burst Chop | Input | MCA |
| ODT | On Die Termination | Input | MCA |
| RESET# | Active Low Asynchronous Reset | Input | MCA |
| DQ[7:0] | Data Input/Output | Input/Output | MCD |
| DQS, DQS# | Data Strobe | Input/Output | MCD |
| DM | Input Data Mask | Input | MCD |
| TDQS, TDQS# | Termination Data Strobe | Output | MCD |
| NC | No Connect | — | — |
| NF | No Function | — | — |
| VDDQ | DQ Power Supply | Supply Votage | — |
| VDD | Power Supply | Supply Votage | — |
| VSSQ | DQ Ground | Supply Votage | — |
| VSS | Ground | Supply Votage | — |
| VREFCA | Reference voltage for CA | Supply Votage | — |
| VREFDQ | Reference voltage for DQ | Supply Votage | — |
| ZQ | Reference pin for ZQ calibration. | Supply Votage | — |

F I G. 9

50

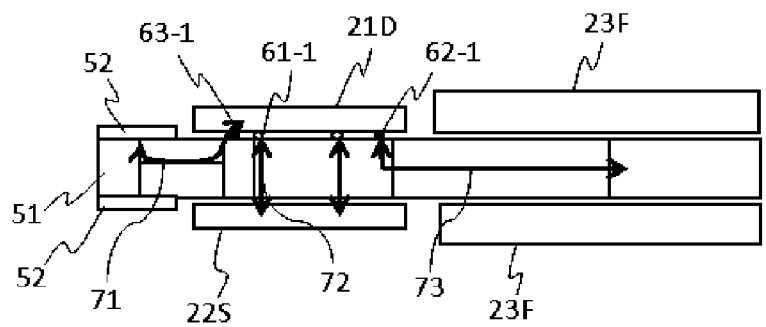

F I G. 10A
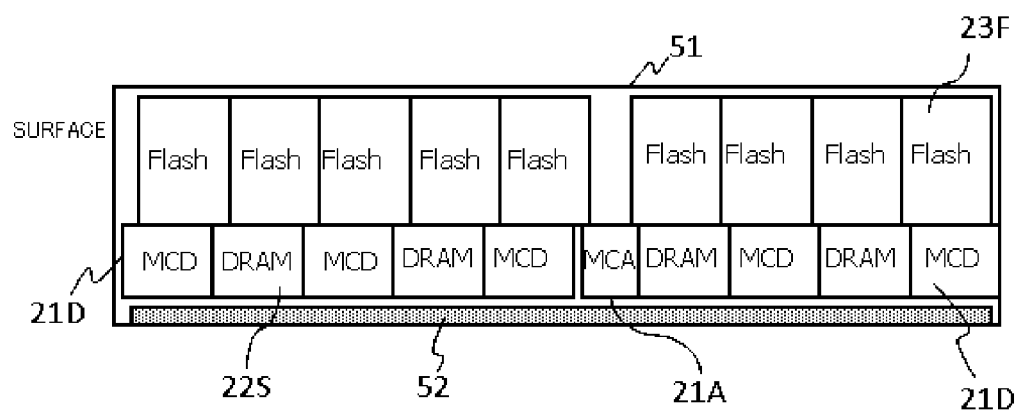
F I G. 10B
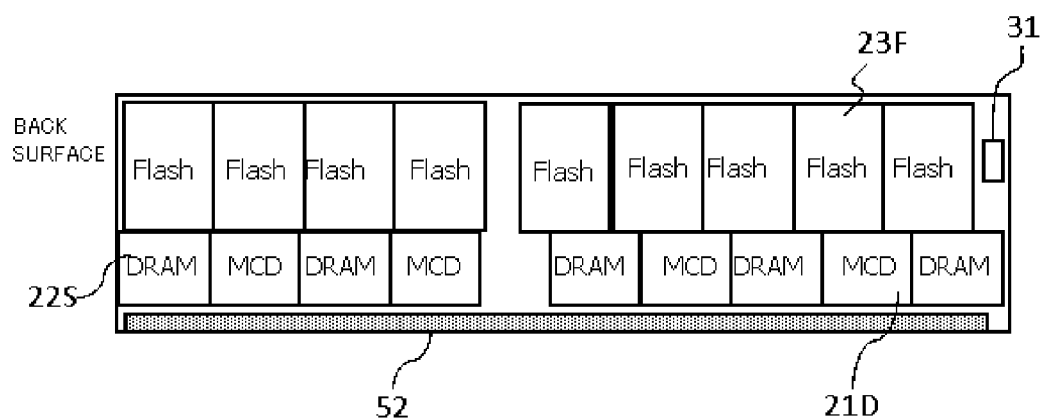

F I G. 13A
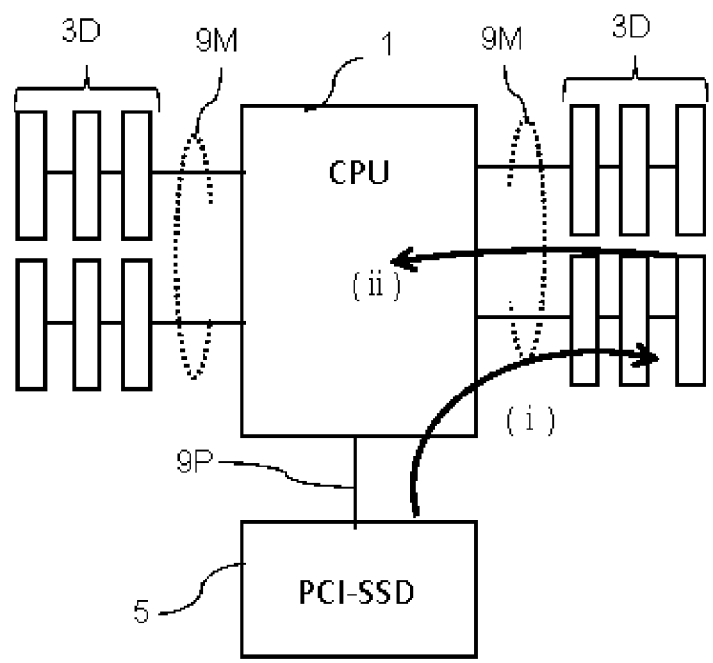
F I G. 13B
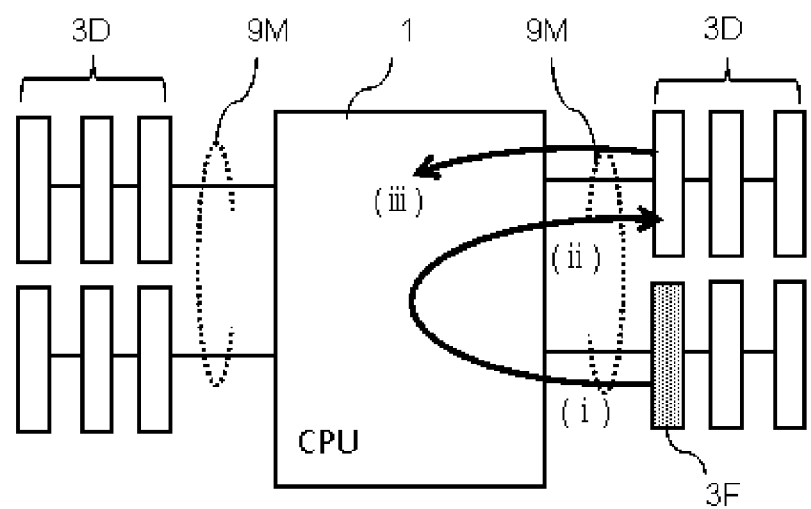

US 9,658,783 B2

DRAM HAVING SDRAM INTERFACE AND FLASH MEMORY CONSOLIDATED MEMORY MODULE

TECHNICAL FIELD

The present disclosure relates to an information processing device, and relates, for example, to an information processing device having a mounted memory module in which a high-speed memory and a large-capacity memory are consolidated.

BACKGROUND ART

In the field of servers or the like, for the era of big data, there are increased needs for accessing large volume data such as a database (DB) at high speed. The trend to increase the capacity of the main storage unit including a DRAM (Dynamic Random Access Memory) has not been able to follow the above-described needs, due to the deficiency of three-dimensional memory packaging technology (TSV). There is a difference of approximately $10^6$ between throughputs (latency) of a DRAM and a SAS (Serial Attached SCSI) connection SSD (Solid State Drive) or an HDD (Hard Disk Drive), as an auxiliary storage unit.

PCI (Peripheral Component Interconnect Express) connection SSD (PCI-SSD), which has high-speed response between the DRAM and the SAS connection SSD (SAS-SSD), has been commercialized. This market is expected to grow bigger.

As a result of prior art search after the present invention, PTL 1 and PTL 2 have been extracted as related matters. PTL 1 discloses an FBDIMM (Fully Buffered DIMM), in which a flash memory and a DRAM are mounted in different DIMMs (Dual Inline Memory Module) and connected in a daisy chain manner with a serial transmission system, through the buffer element for serial transmission mounted in each module. The memory controller transmits a serialized control signal, an address signal, and a write data signal to the DIMM, and receives a serialized read data signal, in accordance with an FBDIMM signal transmission protocol.

PTL 2 discloses a memory module, in which an SDRAM chip (DRAM) of 256 Mb, a NAND type flash memory chip (FLASH) of 264 Mb, and a control circuit chip controlling the DRAM and the FLASH are mounted in one package (BGA package). The memory module secures a region for copying a part of or entire data of the FLASH, and transfers the data from the FLASH to the DRAM in advance, thereby enabling to read the data of the FLASH approximately at the same speed as that of the DRAM.

CITATION LIST

Patent Literature

PTL 1: Japanese Patent Application Publication No. 2010-524059

PTL 2: Japanese Patent Application Publication No. 2020-366429

SUMMARY OF INVENTION

Technical Problem

Though the throughput of the PCI-SSD has become better than that of the SAS-SSD, there is still a difference of $10^3$ between the throughput of the DRAM and the throughput of the PCI-SSD. The arithmetic capacity of the information processing device, such as a server or the like, handling big data has a bottleneck in the throughput of reading data. For further improvement of the performance, it is examined to mount a reasonable large capacity memory on a CPU memory bus at the highest throughput band. As a result, the present inventors have found the following problems.

In the case of a system for connecting a memory module which includes a DRAM as a high-speed memory and a flash memory as a large capacity memory at a lower speed than the DRAM, to the CPU memory bus, at the time of sequential read, the busy rate of the CPU memory bus increases, resulting in performance degradation.

Solution to Problem

Of the present disclosure, the typical one will briefly be described as follows.

That is, the information processing device has a CPU, a CPU memory bus, and a main storage unit. The main storage unit has a first memory module and a second memory module. The first memory module has a first memory. The second memory module has a second memory with the same memory interface as that of the first memory, a third memory with a memory interface different from that of the first memory, and a controller which controls them. The first memory module and the second memory module are accessed by the memory interface of the first memory.

Advantageous Effects of Invention

According to the above-described information processing device, it is possible to improve the throughput of the CPU memory bus.

BRIEF DESCRIPTION OF DRAWINGS

FIG. 1 is a diagram illustrating a configuration of a server according to an example.

FIGS. 2A and 2B are block diagrams of a memory module according to the example.

FIG. 3A is a diagram illustrating a configuration of an SDRAM memory module.

FIG. 3B is a diagram illustrating a terminal arrangement of a surface of the SDRAM memory module.

FIG. 3C is a diagram illustrating a terminal arrangement of a back surface of the SDRAM memory module.

FIG. 3D is a diagram illustrating functions and the like of terminals of the SDRAM memory module.

FIG. 7 is a diagram illustrating a ball arrangement provided in the consolidated memory module according to the example.

FIG. 8A is a diagram illustrating a terminal arrangement of an SDRAM.

FIG. 8B is a diagram illustrating functions and the like of the SDRAM.

FIG. 9 is a diagram illustrating a signal transmission path of the consolidated memory module according to the example.

FIGS. 10A and 10B are diagrams illustrating a component arrangement of a consolidated memory module according to Modification 1.

FIGS. 13A and 13B are diagrams illustrating a configuration of a server which has been examined prior to the present disclosure.

DESCRIPTION OF EMBODIMENT

Figure 4A:
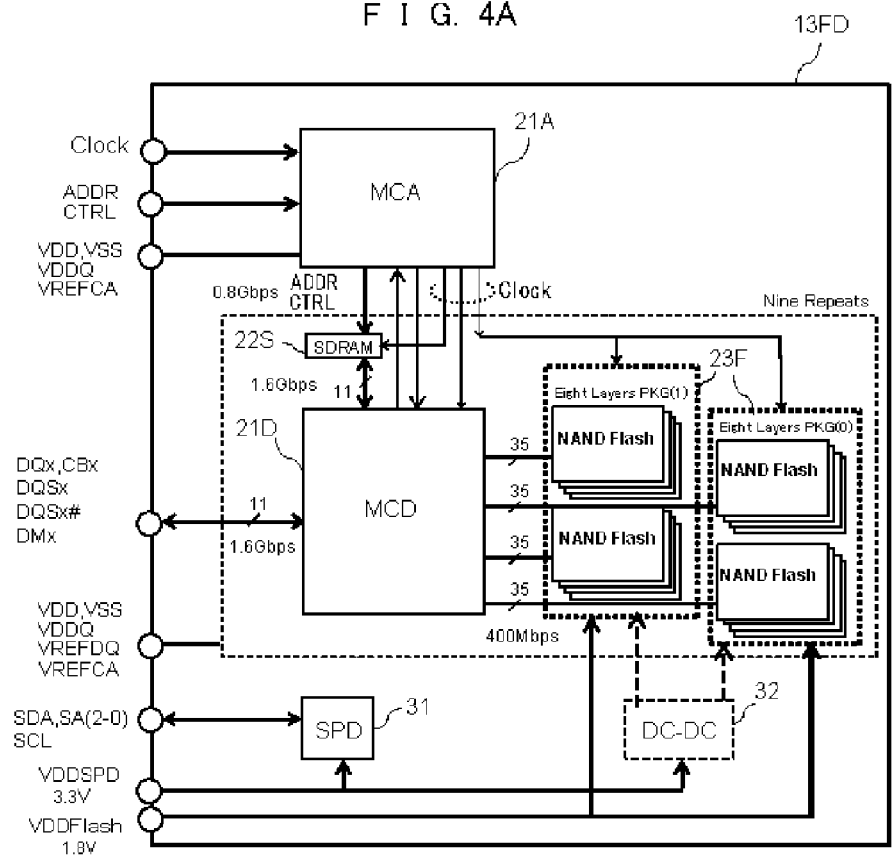
FIG. 4A is a specific block diagram of a consolidated memory module according to the example.

Descriptions will now be made of an embodiment, examples, and modifications, with reference to the accompanying drawings. In the entire drawings for explaining the embodiment, the examples, and the modifications, those having the same functions are given the same reference numerals, and will not repeatedly be described.

In this disclosure, a DRAM is a memory for use for the main storage unit, and includes a clock synchronous type DRAM (hereinafter generally referred to as an SDRAM) such as an SDRAM (Synchronous DRAM), a DDR-SDRAM (Double Data Rate SDRAM), a DDR2-SDRAM, a DDR3-SDRAM, and a DDR4-SDRAM. A DIMM is a memory module having a plurality of packaged memories, and is used for the main storage unit (a primary storage unit). Its functions, size, and pin arrangement are based on a JDEC standard. A memory bus is a bus for connecting a CPU and the main storage unit, and the data bus width is relatively wide, for example, 64 bits. No device other than the CPU and the main storage unit is connected to the memory bus. An I/O bus is a bus for connecting the CPU and an input/output device or an auxiliary storage unit (a secondary storage unit), and the data bus width is relatively narrow, for example, 8 bits. The CPU includes a memory controller and the like for controlling an arithmetic unit (CPU core), a cache memory, and an external memory.

1. Technique Examined Prior to Present Disclosure (1) PCI-SSD

FIG. 13A is a diagram illustrating a configuration of a server examined prior to the present disclosure. A server 101 has a CPU 1, a memory module 3D, and a PCI-SSD 5. To the CPU 1, memory buses 9M as four channels are connected. Three DRAM memory modules (DRAM memory modules) 3D are mountable to each of the memory buses 9M. To the CPU 1, the PCI-SSD 5 is connected through a PCIe bus 9P as an I/O bus. The memory interface of the memory module 3D differs from the memory interface of the PCI-SSD 5.

The CPU 1 cannot directly read data from the memory of the I/O space to the built-in cache memory. Thus, a memory space is secured in the DRAM memory modules 3D, to read data of the PCI-SSD 5. Then, it reads the data mainly from the DRAM memory module 3D. In the reading procedure, a DMAC (Direct Memory Access Controller) in the CPU 1 reads data from the PCI-SSD 5, and writes it to a DRAM-DIMM 3D. After this, the CPU 1 reads the data from the DRAM memory module 3D, and performs an arithmetic operation. Thus, the memory buses 9M are used twice at the time of sequential read. That is, data transmission via the memory buses 9M is performed through both of a path (i) for writing data read from the PCI-SSD 5 into the DRAM memory module 3D and a path (ii) through which the CPU 1 reads data from the DRAM memory module 3D. The data throughput decreases up to ½ of the data throughput of the memory buses 9M. The PCIe bus 9P will be a bottleneck.

(2) Flash Memory Module

Figure 12A:
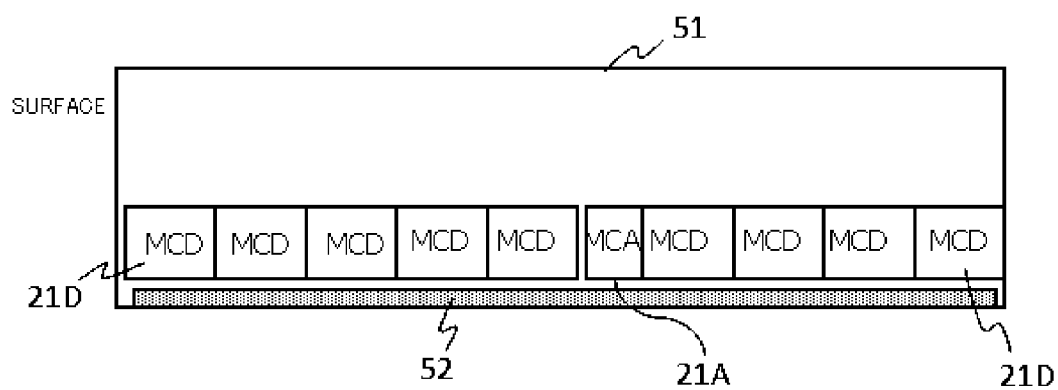
FIGS. 12A and 12B are diagrams illustrating a component arrangement of a consolidated memory module according to Modification 3.

FIG. 13B is a diagram illustrating a configuration of another server examined prior to the present disclosure. A server 102 has a CPU 1, a memory module 3D, and a memory module 3F. Like FIG. 13A, to the CPU 1, memory buses 9M as four channels are connected. Three DRAM memory modules (DRAM memory modules) 3D are mountable to each of the memory buses 9M. The difference from FIG. 12A is that one of the memory modules connected to the memory buses 9M is a memory module (FLASH memory module) 3F of the flash memory, instead of the PCI-SSD 5. The memory interface of the DRAM memory module 3D differs from the memory interface of the FLASH memory module 3F. Additional examination may be necessary on how to perform the reading to the memory buses 9M by the memory interface of the FLASH memory module 3F. Descriptions will be made below on the assumption that the reading is possibly performed.

Like the above-described PCI-SSD 5 (1), to read the data of the FLASH memory module 3F, the memory space is secured in the DRAM memory module 3D, and the data is read mainly from the DRAM memory module 3D. In the reading procedure, the DMAC in the CPU 1 reads the data from the FLASH memory module 3F. After this, the device driver once writes it in the secured DRAM memory module 3D of the main storage space. Finally, the CPU 1 reads the data from the DRAM memory module 3D, and performs an arithmetic operation. Thus, the memory buses 9M are used three times at the time of sequential read. That is, data transmission via the memory buses 9M is performed through a path (i) for reading data from the FLASH memory module 3F, a path (ii) for writing data from the CPU 1 to the DRAM memory module 3D, and a path (iii) through which the CPU 1 reads data from the DRAM memory module 3D. As a result, the busy rate of the memory buses 9M increases, thus easily causing performance degradation.

2. Embodiment

Figure 14:
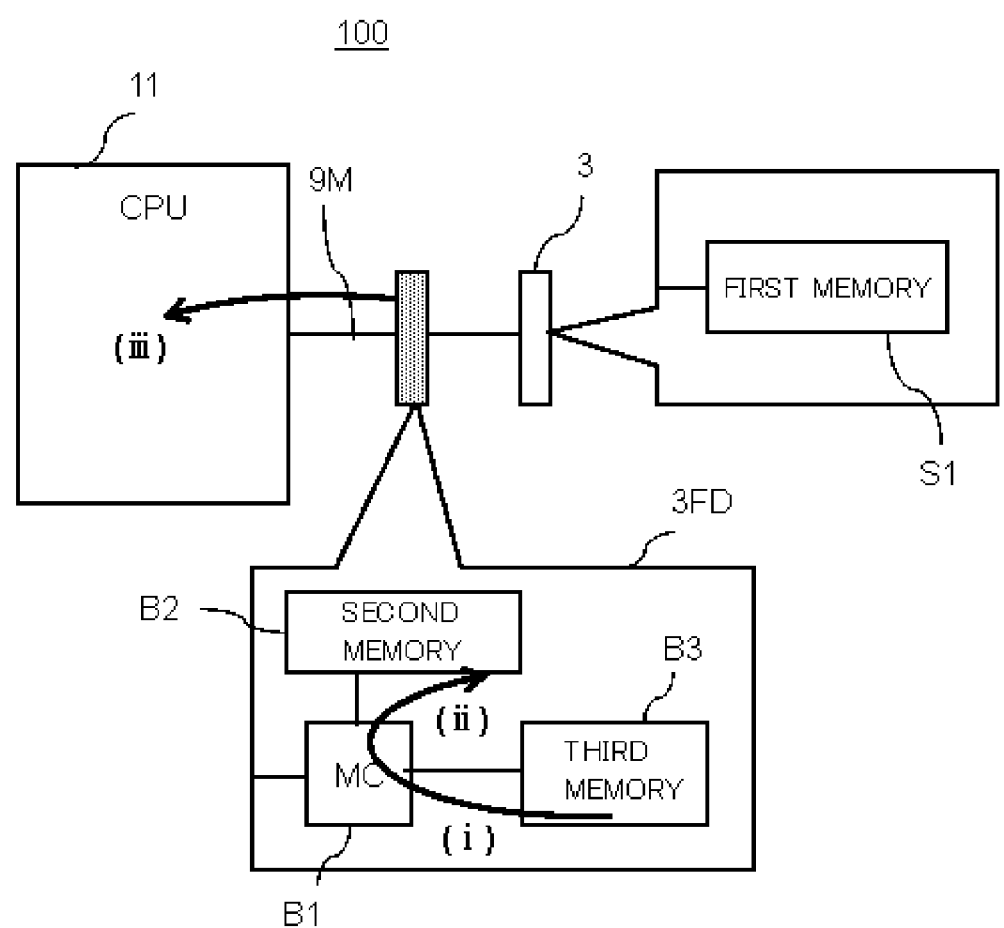
FIG. 14 is a diagram illustrating a configuration of an information processing device according to an embodiment.

FIG. 14 is a diagram illustrating a configuration of an information processing device according to an embodiment. An information processing device 100 has a CPU 111, memory buses 9M, a memory module (a first memory module) 3, and a memory module (a second memory module) 3FD. To the CPU 11, the memory buses 9M are connected. To the memory buses 9M, the memory module 3 and the memory module 3FD are connected. The memory interface of the memory module 3 is the same as the memory interface of the memory module 3FD. Note that the memory module 3 and the memory module 3FD form the main storage unit.

In the memory module 3, a first memory S1 is mounted. In the memory module 3FD, a second memory B2, a third memory B3, and a memory controller (MC) B1 are mounted. The read time of the third memory is longer than the read time of the second memory B2. The memory interface of the first memory S1 mounted in the memory module 3 is the same as the memory interface of the second memory mounted in the memory module 3FD. The memory interface of the second memory B2 mounted in the memory module 3FD is different from the memory interface of the third memory B3. The memory controller B1 operates in a manner that the memory interface of the memory module 3 is the same as the memory interface of the memory module 3FD.

A memory space is secured in the second memory B2 in the memory module 3FD. Then, data is read from the second memory B2. In the reading procedure, the memory controller (MC) B1 reads data from the third memory B3, and then, the memory controller (MC) B1 once writes the data into the second memory B2 in the memory module 3FD. Finally, the CPU 1 reads the data from the second memory B2, and performs an arithmetic operation. Thus, the memory buses 9M are used only once at the time of sequential read.

Data transmission is performed without via the memory buses 9M, through the reading path from the third memory B3 and the writing path into the second memory B2 (i) (ii), while data transmission is performed via the memory buses 9M through the reading path (iii) from the second memory B2. As a result of this, the data throughput can be maximized up to the limit of the memory bus.

Some of the plurality of memory modules 3 forming the main storage unit are replaced by the memory module 3FD, thereby enabling to connect to the memory bus. By connecting the memory module 3FD to the memory buses 9M, it is possible to increase the memory capacity (memory capacity of the main storage unit) connected to the memory buses 9M, without increasing the number of memory modules.

EXAMPLE

In this example, descriptions will be made of a server as an example of the information processing device. However, it is applicable to any information processing device other than the server, for example, a PC (Personal Computer). Descriptions will be made of a memory module with an ECC attached thereto, as an example of the memory module. However, it is applicable to any module without an ECC. Descriptions will be made of an SDRAM (DRAM) as an example of a high-speed memory. The high-speed memory may, for example, be an MRAM (Magnetic Random Access Memory), an STT (Spin Transfer Torque)-RAM, a phase change memory, and the like. The SDRAM is one example of a volatile semiconductor memory that cannot keep data at the time of power-off. Descriptions will be made of a flash memory as an example of a non-volatile memory. However, it is not limited to this, as long as the semiconductor memory can keep data at the time of power-off and store larger volume data than that of the high-speed memory.

<Overall Configuration>

FIG. 1 is a diagram illustrating a configuration of a server according to the example. A server 10 has two CPUs 11 and 12, a plurality of memory modules 13, an IOH (Input Output Hub) 14, a PCI-SSD 15, a SAS (Serial Attached SCSI) bridge 16, and a SAS-SSD/HDD 17. The CPUs 11 and 12 are connected with each other through two QPI buses (Quick Path Interconnect) 19Q. The CPUs 11 and 12 are connected with memory buses 19M as four channels. One channel of the memory buses 19M has a data width of 8 B (bytes), and ECC data of 1 B (byte) is attached thereto. Each channel of the memory buses 19M is connectable to three memory modules 13. The CPUs 11 and 12 are connected with each other through the IOH 14 and the QPI buses 19Q. The IOH 14 is connected to the PCI-SSD 15 through a PCIe bus 19P. The IOH 14 is connected to the SAS bridge 16 through the PCIe bus 19P. The SAS bridge 16 is connected to the SAS-SSD/HDD 17 through an SAS bus 19S. Note that the CPU 12 and memory modules connected to it may not be provided.

The memory modules 13 include memory modules (SDRAM memory modules) 13D with SDRAM mounted therein and memory modules (consolidated memory modules) 13FD with a flash memory and an SDRAM mounted therein. For example, the memory buses 19M of the CPUs 11 and 12 are connected to 11 memory modules 13D and one memory module 13FD. When connecting the memory module 13FD to the memory buses 19M, it is preferably provided in the nearest position to the CPUs 11 and 12. When connecting the plurality of memory modules 13FD to the memory buses 19M, they are preferably connected to the memory buses 19M of different channels, instead of connecting to the memory buses 19M of the same channel. The memory module 13D and the memory module 13FD are accessed through the memory interface of the SDRAM by the CPUs 11 and 12.

FIG. 2s are diagrams illustrating a partial configuration of a server according to the example. FIG. 2A is a side view of a substrate on which a CPU and memory modules are mounted. The CPU 11 is mounted into a socket 27 attached on a substrate (motherboard) 26. The memory modules 13D and 13FD are mounted into sockets 28 attached on the substrate 26. The CPU 12 and the memory modules 13D and 13FD are similarly mounted. Descriptions will hereinafter be made of the CPU 11, but will not be made to the CPU 12, because the CPU 12 is similarly formed.

FIG. 2B is a block diagram of a CPU and a consolidated memory module. The CPU 11 has a built-in memory controller 24 which controls the memory modules 13D and 13FD, and the memory controller 24 is controlled by a hypervisor 25. The CPU 11 has a non-illustrative built-in cache memory. The memory controller 24 stores data read from the memory modules 13D and 13FD into the cache memory. The consolidated memory module 13FD has a memory controller (MC) 21, an SDRAM 22, and a flash memory (FLASH) 23. The SDRAM 22 has a capacity of, for example, 8 GB, while the flash memory has a capacity of 1 TB. The memory controller 21 interfaces among the memory buses 19M, the SDRAM 22, and the flash memory 23.

<Operation Schemes>

When reading data from the flash memory 23 of the consolidated memory module 13FD, the memory controller 21 reads the data from the flash memory 23, writes it into the SDRAM 22. After this, the memory controller 21 reads the data from the SDRAM 22.

When writing data into the flash memory 23 of the consolidated memory module 13FD, the memory controller 21 writes the data into the SDRAM 22. After this, the memory controller 21 reads the data from the SDRAM 22, and writes it into the flash memory 23.

A path (i) for writing data into the SDRAM 22 after reading the data from the flash memory 23 is formed without via the memory buses 19M, while only a path (ii) for reading the data from the SDRAM 22 is formed via the memory buses 19M. This results in maximizing the data throughput up to the limit of the memory bus.

<Configuration of SDRAM Memory Module>

FIG. 3A is a diagram illustrating a configuration of the SDRAM memory module. FIG. 3A(a) is a diagram illustrating the surface, while FIG. 3A(b) is a diagram illustrating the back surface. FIG. 3B is a diagram illustrating a terminal arrangement of the surface of the SDRAM memory module. FIG. 3C is a diagram illustrating a terminal arrangement of the back surface of the SDRAM memory module. FIG. 3D is a diagram illustrating terminal functions of the SDRAM memory module.

The SDRAM memory module 13D uses an RDIMM (Registered DIMM) with 240 pins and is formed with DDR3-SDRAMs, based on a JEDEC standard. The RDIMM is a DIMM, which once receives an address signal and a control signal using an IC (Integrated Circuit), called as a registered buffer on the DIMM substrate, and shapes and amplifies them. Then, the RDIMM distributes the signals to the SDRAMs. As illustrated in FIG. 3A, 18 SDRAMs 24 are mounted, one registered buffer IC 43F is mounted, and one SPD (Serial Presence Detect) 44 is mounted, on the surface of a substrate 41 of the SDRAM memory module 13D. 18 SDRAMs 24 are mounted, and one registered buffer IC 43R is mounted, on the back surface of the substrate 41. Of them, two SDRAMs 24 on the surface and two SDRAMs 24 on the back surface are for ECC data. That is, the SDRAM memory module 13D is an RDIMM of 32 GB with ECC. Data is 4 Gb×64, while ECC is 4 GB×8. The SDRAM 24 is a DDR3-SDRAM of 8 Gb (1 Gb×8), and two chips of the DDR3-SDRAM of 4 Gb (1 Gb×8) are mounted in a BGA package. The memory module 13D may be an LRDIMM (Load-Reduced DIMM) where the data signal is also buffered. In this case, the terminal arrangement and terminal functions of the LRDIMM are the same as the terminal arrangement and the terminal function of the RDIMM.

As illustrated in FIG. 3B and FIG. 3C, each of terminals 42F and 42R includes 120 terminals. Functions of the terminals are as illustrated in FIG. 3D. In FIG. 3D, a small letter "x" following a large letter(s) represents that there are a plurality of terminals with the same function. In FIG. 3B and FIG. 3C, a numeral is given in place of the letter "x". A symbol "#" represents a signal of "active low".

<Configuration of Consolidated Memory Module>
(Overall Configuration)

Figure 4B:
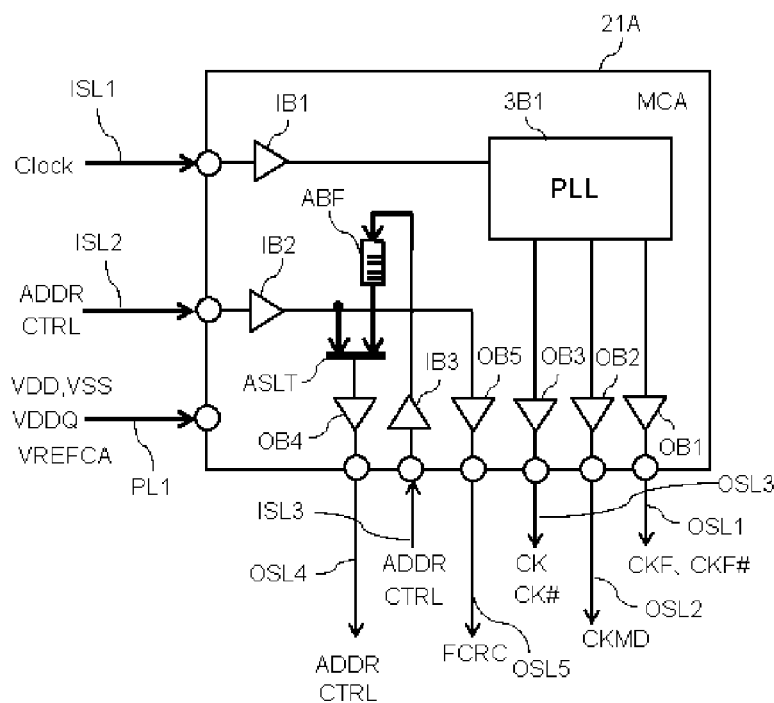
FIG. 4B is a block diagram of a memory controller for address according to the example.
Figure 4C:
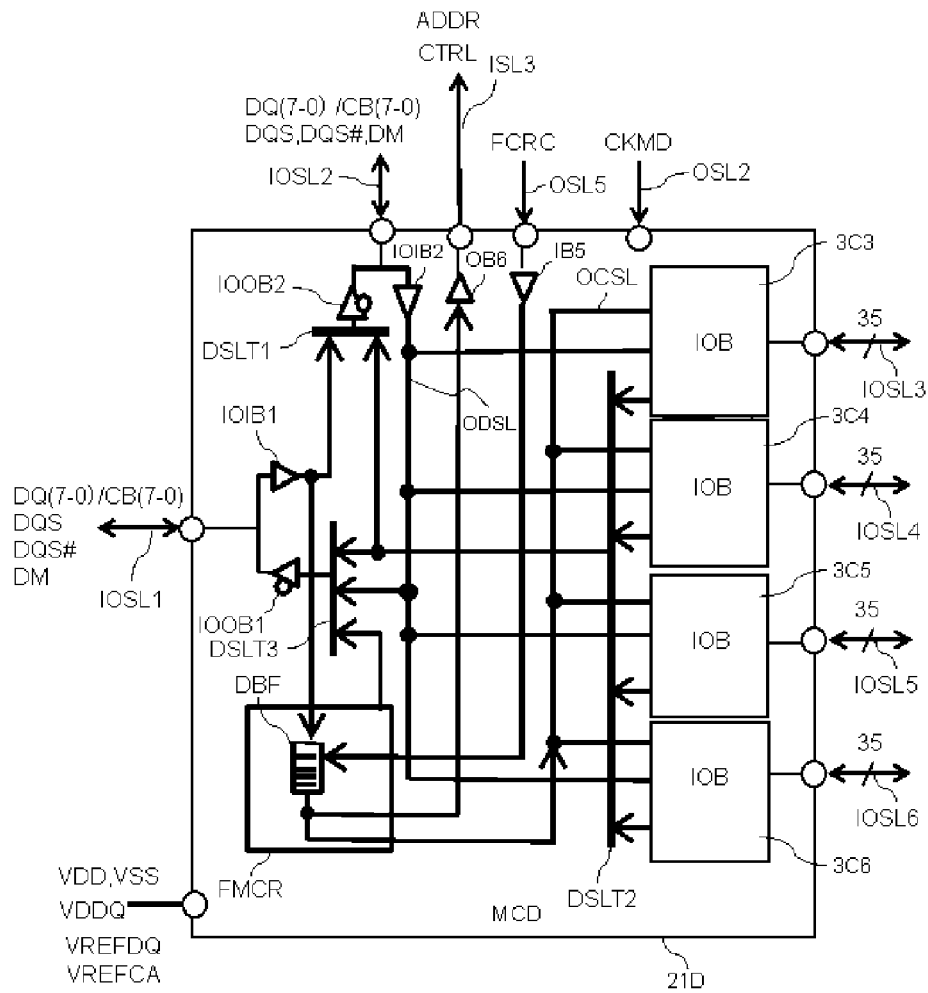
FIG. 4C is a block diagram of a memory controller for data according to the example.
Figure 4D:
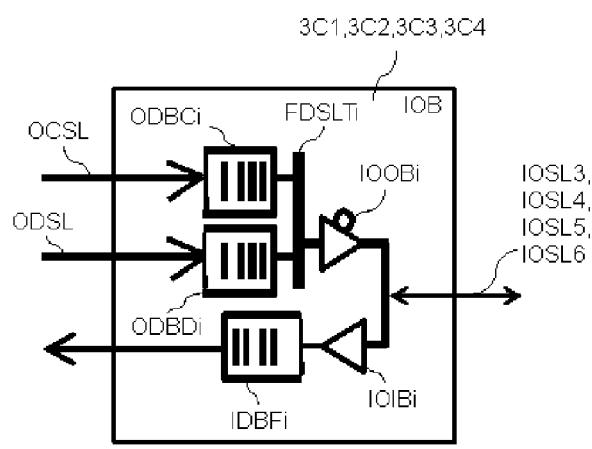
FIG. 4D is a block diagram of an input/output buffer unit of the memory controller for data according to the example.
Figure 4E:
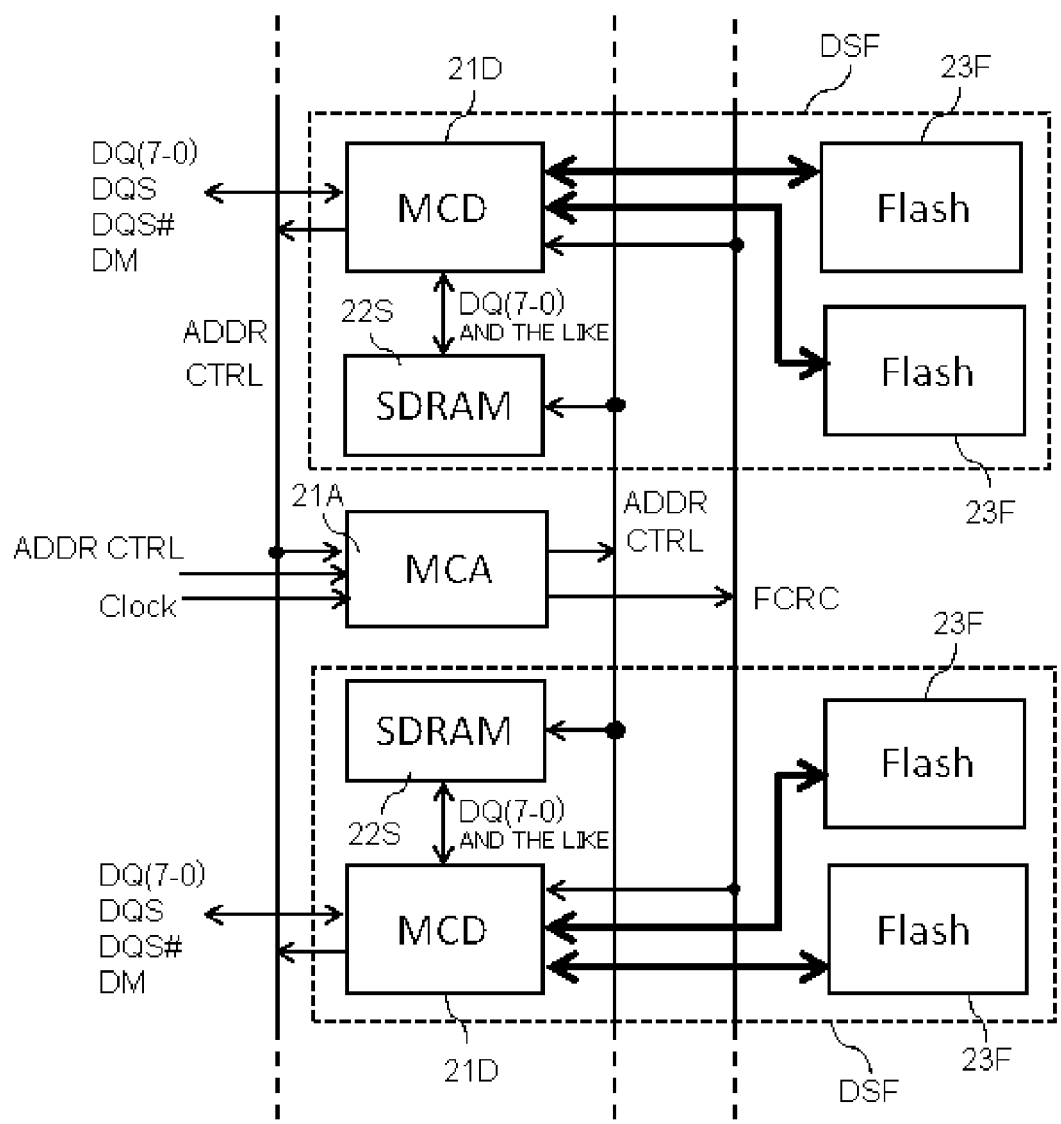
FIG. 4E is a block diagram illustrating a part of the consolidated memory module according to the example.

FIG. 4A is a diagram illustrating an overall configuration of a consolidated memory module according to the example. FIG. 4B is a block diagram of a memory controller for address. FIG. 4C is a block diagram of a memory controller for data. FIG. 4D is a diagram illustrating a flash memory input/output buffer circuit. FIG. 4E is a block diagram illustrating a part of a memory module according to the example.

As illustrated in FIG. 4A, the consolidated memory module 13FD has a memory controller 21A for address (MCA), a memory controller 21D for data (MCD), an SDRAM 22S, and a flash memory(s) 23F. The memory controller 21A for address and the memory controller 21D for data form the memory controller 21. The memory controllers 21D for data, the number of which is equal to the number of SDRAM 22S to be mounted, are mounted in the consolidated memory module 13FD, while one memory controller 21A for address is mounted in the consolidated memory module 13FD. The flash memories 23F, the number of which is twice the number of SDRAMs 22S, are mounted in the memory module 13FD.

More specifically, the consolidated memory module 13FD has 18 flash memories 23F with a capacity of 64 GB and 9 SDRAMs 22S with a capacity of 1 GB, mounted therein. The capacity of the flash memory 23F is 64 times that of the SDRAM 22S, that is, in a range between 10 times and less than 100 times. Two flash memories 23F and one SDRAM 22 are to store data for ECC. This results in forming the SDRAM 22 of 8 GB and the flash memory 23 of 1 TB. The memory module 13FD has 9 memory controllers 21D for data and one memory controller 21A for address, mounted therein. Each of the memory controllers 21D for data and the memory controller 21A for address is formed with a semiconductor chip, and mounted in a BGA type package. The flash memory 23F with the capacity of 64 GB is mounted in one GBA type package, in which 8 NAND type flash memory chips (NAND Flash) are laminated. The flash memory 23F is an interface (ONFI (Open NAND Flash Interface) or Toggle DDR) corresponding to a DDR2, and has a throughput of 400 Mbps. As illustrated in FIG. 4A and FIG. 4E, one memory controller 21D for data controls one SDRAM 22S and two flash memories 23F. In the SDRAM 22S, one or a plurality of DDR3-SDRAM chips of 1 GB are mounted in one BGA type package. The interface of the SDRAM 22S has a throughput of 1600 Mbps. The SDRAM 22S may be formed using a DDR4-SDRAM chip(s), instead of the DDR3-SDRAM chip(s). The read time of the flash memory 23F is longer than the read time of the SDRAM 22S. The read time of the flash memory 23F is the order of 10 μs, while the read time of the SDRAM 22S is the order of 10 ns. In this case, the read time implies a time range since a read command (a read command is issued) until the first data is read.

The consolidated memory module 13FD has an SPD (Serial Presence Detect) 31 and a DC-DC converter 33. An SPD 31 and an SPD 44 are formed with an EEPROM which stores information regarding the memory module itself (for example, the type or configuration of the memory chip, the memory capacity, information regarding the presence of an ECC (error correction code) or parity). After the memory module is attached and the power is on, information inside the SPDs 31 and 44 are automatically read, to perform setting for using the memory module. The DC-DC converter 32 generates a power supply voltage (VDDFlash=1.8 V) for the flash memory 23F from a power supply voltage (VDDSPD=3.3 V) for the SPD 31. If reserved pins (NC pins) of the memory module can be assigned to the power supply terminal of the VDDFlash, the DC-DC converter 33 is not necessary.

The consolidated memory module 13FD has socket terminals for connecting to the memory buses 19M. The socket terminals include the same number of terminals as the number of terminals 42F and 42R of the SDRAM memory modules 13D, and have the same terminal arrangement and the same functions (see FIGS. 3B, 3C, 3D). In FIG. 4A, a symbol "O" represents a socket terminal. Signals to be applied to the socket terminals include a clock signal (Clock), an address signal (ADDR), a control signal (CTRL), a data signal (DQ, CB), a data control signal (DQS, DQS#, DM), a power source (VDD, VSS, VDDQ, VREFDQ, VREFCA, VDDSPD, VDDFlash), an SPD signal and the like. The clock signal (Clock) includes a clock signal (CK, CK#) for the SDRAM 22S. The address signal (ADDR) includes an address signal (A15-AO) for the SDRAM 22S and a bank address signal (BA2-BAO). The control signal (CTRL) includes a command signal (RAS#, CAS#, WE#) and a control signal (CKE, S#). In this case, the RAS# is a row address strobe signal, the CAS# is a column address strobe signal, and the WE# is a write enable signal. Those signals, from the socket terminals, necessary for accessing the SDRAM 22S and the flash memory 23F are input once to the memory controller 21A for address or the memory controller 21D for data.

(Memory Controller for Address)

As illustrated in FIG. 4B, the memory controller 21A for address has a PLL 3B1, a buffer register ABF, and a selector ASLT. A clock signal (Clock) on a signal line ILS1 is input to the PLL (Phase Loop Lock) circuit 3B1 through an input buffer circuit IB1. The PLL circuit 3B1 outputs a clock signal (CKF) for the flash memory 23F to a signal line OSL1 through an output buffer circuit OB1, outputs a clock signal (CKMD) for the memory controller 21D for data to a signal line OSL2 through an output buffer circuit OB2, and outputs a clock signal (CK, CK#) for the SDRAM 22S to a signal line ODL3 through an output buffer circuit OB3. The clock signal (Clock), the clock signal (CK, CK#), and the clock signal (CKMD) are signals having the same frequency. The clock signal (CKF, CKF#) is a signal at one-fourth frequency of the clock signal (Clock), the clock signal (CK, CK#), and the clock signal (CKMD). The clock signal at one-fourth frequency is generated by a frequency divider in the PLL 3B1.

An address signal (ADDR) and a control signal (CTRL) on a signal line ISL2 are input to a selector ASLT through an input buffer circuit IB2. An address signal (ADDR) for the SDRAM 22 and a control signal (CTRL) are output to a signal line OSL4 through an output buffer circuit OB4. A part of the address signal (ADDR) and the control signal (CTRL) is output as a control signal (FCRC) of a control register FMCR to be described later, through an output buffer circuit OB5. An address signal (ADDR) and a control signal (CTRL) output from a flash memory control register FMCR on a signal line ISL3 are stored in the buffer register ABF, through an input buffer circuit IB3. They are used, when data of the flash memory 23F is written into the SDRAM 22S, or when data of the SDRAM 22S is written into the flash memory 23F. The address signal (ADDR) and the control signal (CTRL) stored in the buffer register ABF are input to the selector ASLT, and then output to the signal line OSLO, through the output buffer circuit OB4.

A power source (VDD, VDDQ, VREFDQ, VSS) on a power line PL is input. In FIG. 4B, a symbol "O" between a signal line and an input buffer circuit or an output buffer circuit represents an external terminal of the memory controller 21A for address. The external terminals include the same number of terminals as the number of signal lines connected thereto.

(Memory Controller for Data)

As illustrated in FIG. 4C, the memory controller 21D for data has selectors DSLT1, DSLT2, DSLT3, and a control register FMCR. A data system signal (DQ (7-0)/CB(7-0), DQS, DQS#, DM) for the SDRAM 22S is output to a signal line IOSL2 through a signal line IOSL1, an input buffer circuit IOIB1, the selector DSLT1, an output buffer circuit IOOB2. The signal line IOSL2 is connected to the SDRAM 22S. A data system signal from the SDRAM 22S is output to the signal line IOSL1 through the signal line IOSL2, an input buffer circuit IOIB2, a signal line ODSL, the selector DSLT3, and an output buffer IOOB1.

Information necessary for the flash memory 23F is input from a signal line for transmitting the DQ (7-0) signal in the signal line IOSL1, and stored in a buffer register DBF of the control register FMCR. The information necessary for the flash memory 23S includes an operation code FMOPC for the flash memory, an address FMADDR for the flash memory, an address signal (ADDR) and a control signal (CTRL) for accessing the SDRAM 22S. The control register FMCR is accessed by the memory interface of the SDRAM.

Input/output buffer units (IOB) 3C1, 3C2, 3C3, and 3C4 are connected to the flash memory respectively through signal lines IOSL3, IOSL4, IOSL5, and IOSL6. Each of the signal lines IOSL3, IOSL4, IOSL5, and IOSL6 includes four sets of eight addresses/data items, two data strobes, and one data mask, that is, includes totally 35 lines. As illustrated in FIG. 4D, each of IOBs 3C3, 3C4, 3C5, and 3C6 has output buffer registers ODBCi and ODBDi, an input buffer register IDBFi, a selector FDSLTi, an output buffer circuit IOOBi, and an input buffer circuit IOIBi. In this case, i=3 to 6. The output buffer registers ODBCi and ODBDi are connected respectively to signal lines OCSL and ODSL. The signal line OCSL is connected to the data buffer register DBF. The signal line ODSL is connected to the input buffer circuit IOIB2.

Around the center of the DIMM, there is provided a socket terminal for an address signal (ADDR), a control signal (CTRL), and a clock signal (Clock). Thus, as illustrated in FIG. 4E, the memory controller 21A for address is preferably arranged around the center of the memory module 13FD. In FIG. 4E, those units surrounded with a dotted line include one memory controller 21D for data, one SDRAM 22S, and two flash memories 23F. These units are illustrated simply one each above and below the memory controller 21A for address. However, for example, five of the units may be arranged above the memory controller, and four of the units may be arranged below the memory controller.

(Operations)

The consolidated memory module 13FD is operated by so-called an SDRAM interface. The memory controller 21A for address selects either the control register FMCR provided in the memory controller 21D for data or the SDRAM 22S, based on a value of an externally input address signal (ADDR). Either access is performed in accordance with an SDRAM interface technique. By accessing the control register FMCR and writing an operation code (FMOPC) and an address (FMADDR), data of the flash memory 23F can be loaded to the SDRAM 22S, or data in the SDRAM 22 can be stored in the flash memory 23F.

(1) Read from Consolidated Memory Module (a) Read from Flash Memory

The memory controller 24 inputs an address for accessing the control register FMCR, to the address signal (ADDR). A write command is input to the control signal (CKE, CS#, RAS#, CAS#, WE#). Further, a load command code as an FMOPC, an address for starting to load from the flash memory 23F, and a write address for writing into the SDRAM 22S are input to the data signal (DQ7-DQ0). Then, the memory controller 21A for address inputs a control signal (FCRC) to the control register FMCR through the signal line OSL5 and the input buffer circuit IB5. This results in writing the load command code, the load start address, and the SDRAM write address to the control register FMCR.

After this, the load command code and the load start address are read, and transmitted to the output buffer register ODBCi of the input/output buffer unit (IOB), through the signal line OCSL, by a non-illustrative control circuit. Together with a control signal (AL, CL, E#, R, W, RP#, DQS) for the flash memory 23 which is generated by the non-illustrative control circuit, a load command code and a load start address are sent to the flash memory 23F, and the data is read. The read data is stored in the buffer register IDBFi of the input/output buffer unit (IOB).

(b) Write to SDRAM from Input Buffer Register

The SDRAM write address stored in the buffer register DBF and the control signal (CTRL) generated by the non-illustrative control circuit are output to the signal line ISL3 through an output buffer circuit OB6, and sent to the SDRAM 22S through the memory controller 21A, as described above. Data stored in the input buffer register IDBFi is output to the signal line IOSL2 through the selector DSLT2, the selector DSLT1, and the output buffer circuit IOOB2. As a result, the data read from the flash memory 23F is written into the SDRAM 22S.

(c) Read from SDRAM

When accessing data stored in the SDRAM 22S and from the flash memory 23F, the memory controller 24 inputs an address (the same address as the SDRAM write address) for accessing the SDRAM 22S to the address signal (ADDR) and a read command to the control signal (CKE, CS#, RAS#, CAS#, WE#). Then, the memory controller 21A for address accesses the SDRAM 22S, and reads data. The data read from the SDRAM 22S is sent to the signal line IOSL1 through the signal line IOSL2, the input buffer circuit IOIB1, the selector DSLT3, and the output buffer circuit IOOB1.

(2) Write to Consolidated Memory Module (a) Write to SDRAM

The memory controller 24 inputs an address for accessing the SDRAM 22S to the address signal (ADDR). It inputs a write command to the control signal (CKE, CS#, RAS#, CAS#, WE#). Further, it inputs data to be written to the data signal (DQ7-DQ0). After this, the memory controller 21A for address accesses the SDRAM 22S, and writes the data input to the memory controller 21D for data to the SDRAM 22S through the input buffer circuit IOIB1, the selector DSLT1, and the output buffer circuit IOOB1.

(b) Read from SDRAM

The memory controller 24 inputs an address for accessing the control register FMCR to the address signal (ADDR). It inputs a write command to the control signal (CKE, CS#, RAS#, CAS#, WE#). It inputs an erase command and an erase address as an FMOPC, a store command code, and an address for starting to store data to the flash memory 23F, and a read address for reading data from the SDRAM 22S, to the data signal (DQ7-DQ0). Then, the memory controller 21A for address inputs the control signal (FCRC) to the control register FMCR through the signal line OSL5 and the input buffer circuit IB5. As a result, the erase command and the erase address, the store command code and the store start address, and the SDRAM read address are written into the control register FMCR.

After this, the SDRAM read address stored in the buffer register DBF and the control signal (CTRL) generated by the non-illustrative control circuit are output to the signal line ISL3 through the output buffer circuit OB6, and sent to the SDRAM 22S through the memory controller 21A for address, as described above. Then, data is read from the SDRAM 22S, and stored in the output buffer register ODBDi of the input/output buffer unit (IOB) through the signal line IOSL2 and the input buffer circuit IOIB1.

(c) Write to Flash Memory from Output Buffer Register

After this, by a non-illustrative control circuit, an erase command code and an erase address are read, and transmitted to the output buffer register ODBCi of the input/output buffer unit (IOB) through the signal line OCSL. Together with the control signal (AL, CL, E#, R, W, RP#, DQS) for the flash memory 23F which is generated by the non-illustrative control circuit, the erase command code and the erase address are sent to the flash memory 23F and then erased.

By the non-illustrative control circuit, a store command code and a store start address are read, and transmitted to the output buffer register ODBCi of the input/output buffer unit (IOB) through the signal line OCSL. Together with the control signal (AL, CL, E#, R, W, RP#, DQS) for the flash memory 23F which is generated by the non-illustrative control circuit, the store command code, the store start address, and data stored in the output buffer register ODBDi are sent to the flash memory 23F, and the data is written.

<Control by CPU>

Figure 5:
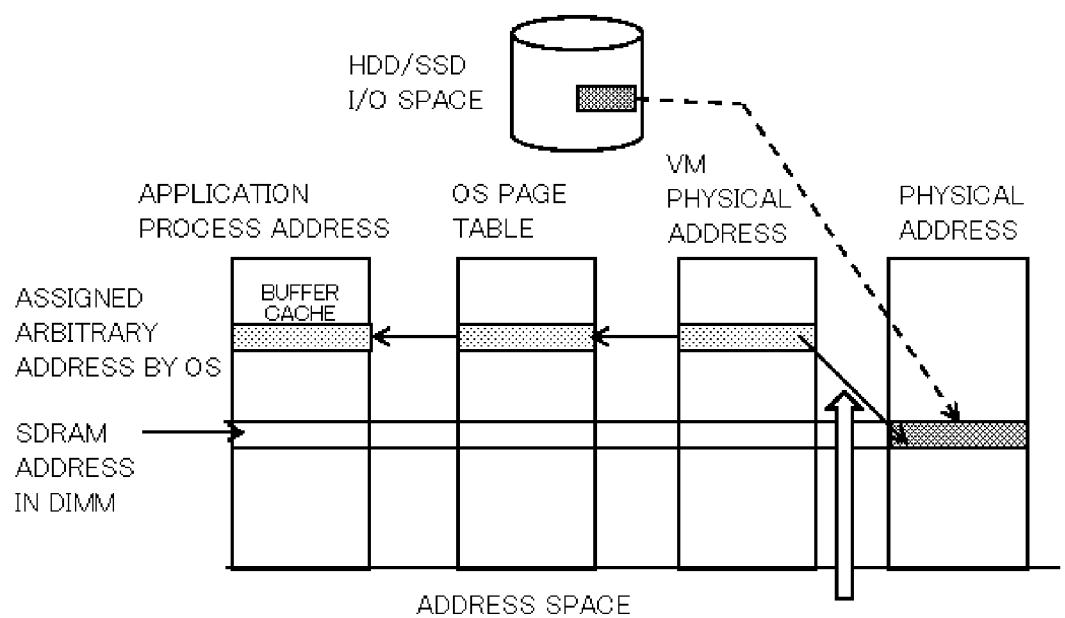
FIG. 5 is a diagram illustrating an address space of the consolidated memory module according to the example.

FIG. 5 is a diagram illustrating an address space of the server 10. Illustrated in FIG. 5 are an application process address, an operating system (OS) page table (Page Table), a physical address of a virtual machine (VM), and an address space of a physical address. The hypervisor directly operates on the hardware, and the entire OS operates on the hypervisor. The application operates on the OS. The VM is realized by the hypervisor. The address of the buffer cache secured by the application is assigned to an arbitrary address by the OS.

The flash memory in the consolidated memory module 13FD exists in the I/O space. Thus, it is necessary to assign the address of data to be read from the flash memory in its I/O space, to a physical address of the memory address space. By the translation by the hypervisor, the address of the buffer cache secured by the application is assigned to the SDRAM inside the consolidated memory module (DIMM). As a result of this, the data inside the consolidated memory module is simply transmitted, thus enabling to prevent excess data transmission to the memory bus.

The memory controller 24 initializes the SDRAM 22S by setting the mode register of the SDRAM 22S, other than the above control. Further, the following control will be performed.

The reliability of the flash memory 23F decreases, if rewriting is repeated. Written data at the rewriting may become different data at the time of reading, or data may not be written at the time of rewriting on rare occasions. The memory controller 24 detects and corrects an error of read data, at the time of reading the data from the consolidated memory module 13FD. The error detection and correction are performed using an error correction circuit in the memory controller 24, based on the data from two flash memories 23F storing the ECC data and one SDRAM 22S.

At the time of rewriting data to the flash memory 23F, the memory controller 24 checks whether the data has correctly been written. When the data has not correctly been written, it writes the data to an address different from the present address. That is, a so-called alternative process (wear leveling) is performed. Address management is also performed, to represent any defective address in association with which address is used for the alternative process.

Because the CPU 11 performs memory management inside the consolidated memory module 3FD, the delay in the memory controller 21 can be minimized.

<Component Arrangement of Memory Module>

Figure 6A:
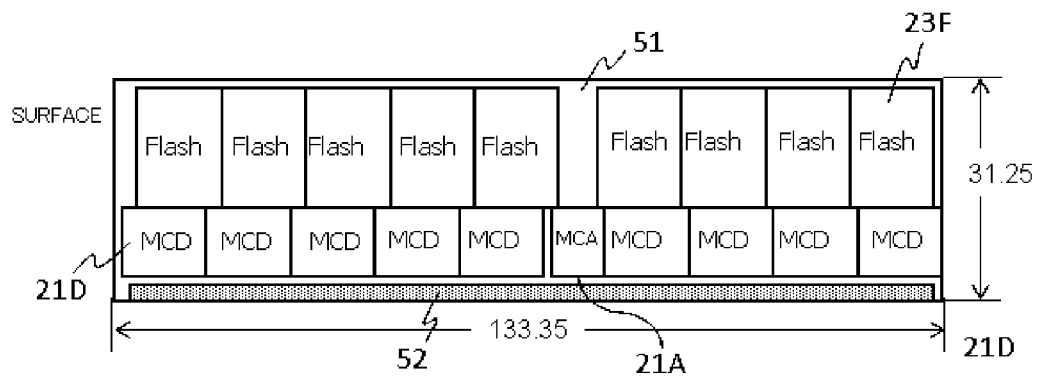
FIGS. 6A, 6B, 6C, and 6D are diagrams illustrating a component arrangement of the consolidated memory module according to the example.
Figure 6B:
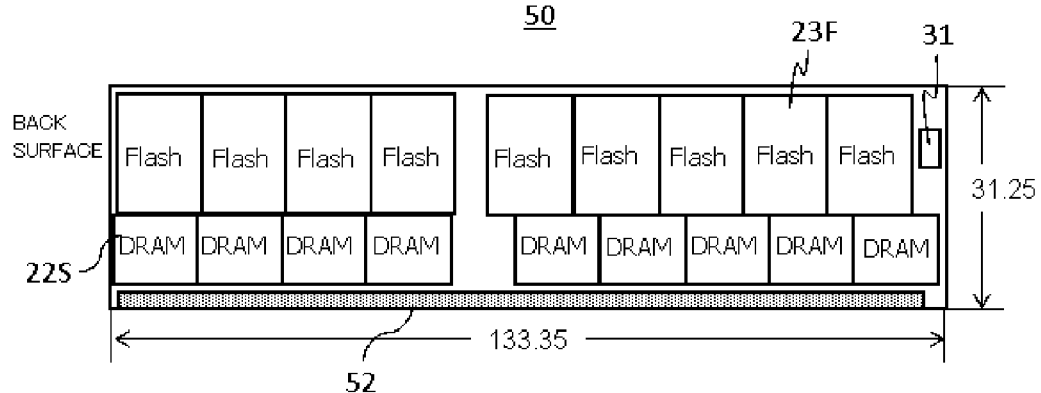
Figure 6C:
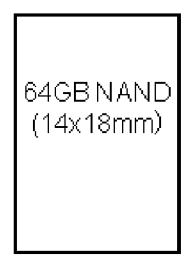
Figure 6D:

FIG. 6s are diagrams illustrating a component arrangement of a memory module according to the example. FIG. 6A illustrates the surface of the memory module, while FIG. 6B illustrates the back surface of the memory module. FIG. 6C illustrates the outside dimensions of a flash memory, while FIG. 6D illustrates the outside dimensions of an SDRAM. A DIMM 50 as one configuration example of the consolidated memory module 13FD has a substrate 51, socket terminals 52 on both surfaces of the substrate 51, one memory controller 21A for address (MCA), 18 memory controllers 21D for data (MCD), 18 SDRAMs (DRAM) 22S, 18 flash memories (Flash) 23F, and one SPD 31. When the memory module 13FD is inserted into the socket 28, the near side (facing side) to the CPU 11 is referred to as the surface, while the far side (opposed side) is referred to as the back surface (the same applies below). The surface and the back surface may be the other way around. The width of the substrate 51 is 133.35 mm, while its height is 31.25 mm.

The memory controller 21A for address is longitudinally arranged, the memory controller 21D for data is horizontally arranged, the SDRAM 22S is horizontally arranged, and the flash memory 23F is longitudinally arranged. As illustrated in FIGS. 6C and 6D, the outside dimensions of the flash memory 23F are 14 mm×18 mm, and the outside dimensions of the SDRAM 22S are 13 mm×9.3 mm. The outside dimensions of the SDRAM differ depending on the semiconductor manufacturers (the size of the semiconductor chip), and may be 12 mm×10.5 mm, 10.5 mm×9.0 mm, 11×9.9 mm, and 10.6×9.0 mm. However, the ball is arranged in the same position. The outside dimensions of the memory controllers 21D for data are the same as those of the SDRAM 22S.

The memory controllers 21D for data are arranged on the surface of the substrate 51, that is, on the side near the socket terminal 52, while the SDRAMs 22S are arranged on the back surface. The flash memories 23F are arranged farther from the socket terminal 52 than the memory controllers 21D for data and the SDRAMs 22S. In other words, the memory controllers 21D for data are arranged on the surface of the substrate 51 and between the socket terminal 52 and the flash memories 23F. The SDRAMs 22S are arranged on the back surface of the substrate 51 and between the socket terminal 52 and the flash memories 23F. The memory controller 21A for address is arranged between the memory controllers 21D for data.

As illustrated in FIG. 6A, four memory controllers 21D for data are arranged on the right side of the memory controller 21A for address, while five memory controllers 21D for data are arranged on the left side thereof. As illustrated in FIG. 6B, on the reference point on the back surface side where the memory controller 21A for address is arranged, five SDRAMs 22S are arranged on the right side, while four SDRAMs 22S are arranged on the left side. The SPD 31 is arranged near the right side end of the back surface of the substrate 51.

Preferably, the mounting positions of the memory controllers 21D for data and the SDRAMs 22S are put together on the surface and back surface thereof.

According to the above configuration, the memory controllers 21D for data and the SDRAMs 22 can be connected with each other at a short distance therebetween, and the socket terminal 52 and the memory controllers 21D for data can be connected with each other at a short distance therebetween.

FIG. 7 is a diagram illustrating a ball arrangement of the package of the memory controller according to this example. FIG. 7 is a bottom view (back surface). As described above, the memory controllers 21D for data and the SDRAMs 22S are mounted in the BGA type package. The external terminal (bump electrode) of the BGA type package is formed with solder balls (balls). The ball pitch of the memory controllers 21D for data is one-half the ball pitch of the SDRAMs 22S. In FIG. 7, balls 61-1 and 61-2 illustrated in the form of white circles are arranged in the same position as the balls of the SDRAMs 22S. Balls 62-1 and 62-2 illustrated in the form of black circles are provided to connect to the external terminal of the flash memories 23F, and are arranged between the white balls. Balls 63-1 and 63-2 illustrated in the form of hatched circles (gray circles) are provided to connect to the socket terminal 52, and are arranged between the white balls. The balls in the form of the white circles of the memory controllers 21D for data are not necessarily connected to the balls of the SDRAMs 22S, and may be connected to the external terminal of the flash memories 23F or the socket terminal 52. In FIG. 7, the balls connected to the external terminal of the flash memories 23F are arranged on the upper side, while the balls connected to the socket terminal 52 are arranged on the lower side.

FIG. 8A is a diagram illustrating a ball arrangement of the package of the SDRAM. FIG. 8A is a top (surface) view. In FIG. 8A, balls are arranged on the back side of the document. Those symbols given respectively below balls shown with dotted circles are marks (symbols) of signal names or the like input/output to/from the terminals of the SDRAM 22S. There are 78 balls. FIG. 8B is a diagram illustrating functions of the terminals of the SDRAM. The field named "CONNECTED CNT" represents whether the terminals of the SDRAM 22S are connected with either the memory controller (MCA) 21A for address or the memory controller (MCD) 21D for data.

In FIG. 8A, six balls are horizontally arranged, while 13 balls are longitudinally arranged. No balls are arranged in three columns at the ball pitch of the SDRAMs 22S, in the three columns respectively on the left and right sides. If balls are arranged between the balls of the SDRAMs 22S, including the vacant three columns, it is possible to arrange totally 425 balls, particularly longitudinally 17 balls, and horizontally 25 balls. The balls of the SDRAMs 22S are 78. Thus, it is possible to assign 347 balls for the connection between the external terminals of the flash memories and socket terminal 52. Note, however, that all of the 78 balls of the SDRAMs 22S are not necessarily connected to the memory controllers 21D for data. Therefore, it is possible to assign more than 347 balls for the connection between the external terminals of the flash memories 23F and the socket terminal 52. For example, as illustrated in FIG. 7, it is possible to assign 49 balls for the socket terminal 52 and 298 balls for the external terminal of the flash memories 23F. Depending on the number of terminals, the balls are not necessarily assigned to the all terminals. For example, in FIG. 7, the terminals near the center may not be arranged.

The balls are arranged in the same positions when the surface with the balls of the memory controllers 21D for data is put together with the surface with the balls of the SDRAMs 22S. The balls in the same positions may be signal terminals to be connected. These are a data signal (DQ[7:0]) and a data control signal (DQS, DQS#(/DQS), DM). The mounting positions of the memory controllers 21D for data and the SDRAMs 22S are put together on the surface and back surface thereof. This enables to connect them with each other at a short distance.

FIG. 9 is a diagram illustrating a signal transmission path of the consolidated memory module according to the example. FIG. 9 is a side view of the consolidated memory module 13FD. In FIG. 9, an arrow in both directions represents a signal path. A signal path 71 is a signal path between the socket terminal 52 and the memory controller 21D for data. A signal path 72 is a signal path between the memory controller 21D for data and the SDRAM 22S. The signal paths 71 and 72 are formed both along a short distance.

A signal path 73 is a signal path between the memory controller 21D for data and the flash memory 23F. The signal path 73 does not require the higher speed transmission than that of the signal paths 71 and 72, but require many signal lines. Therefore, it is possible to extend it in the substrate 51 which is formed with multilayer wirings of approximately ten layers.

<Modification 1>

FIG. 10s are diagrams illustrating a component arrangement of a consolidated memory module according to a modification 1. FIG. 10A illustrates the surface of the memory module, while FIG. 10B illustrates the back surface of the consolidated memory module. A DIMM 50A according to Modification 1 includes memory controllers 21D for data (MCD) and SDRAMs (DRAM) 22S alternately, on the surface and the back surface of a substrate 51. The arrangement of memory controllers 21A for address, flash memories (Flash) 23F, an SPD 31, and a socket terminal 52 is the same as that of the memory module 50 according to the example. There is much wiring between the memory controllers 21D for data (MCD) and the flash memories (Flash) 23F. Thus, it is possible to generate the wiring margin, by alternately arranging the memory controllers 21D for data (MCD) and the SDRAMs (DRAM) 22S.

In FIG. 10s, five memory controllers 21D for data (MCD) and four SDRAMs (DRAM) 22S are arranged on the surface of the substrate. However, four memory controllers 21D for data (MCD) and five SDRAMs (DRAM) 22S may be arranged on the surface of the substrate.

<Modification 2>

Figure 11A:
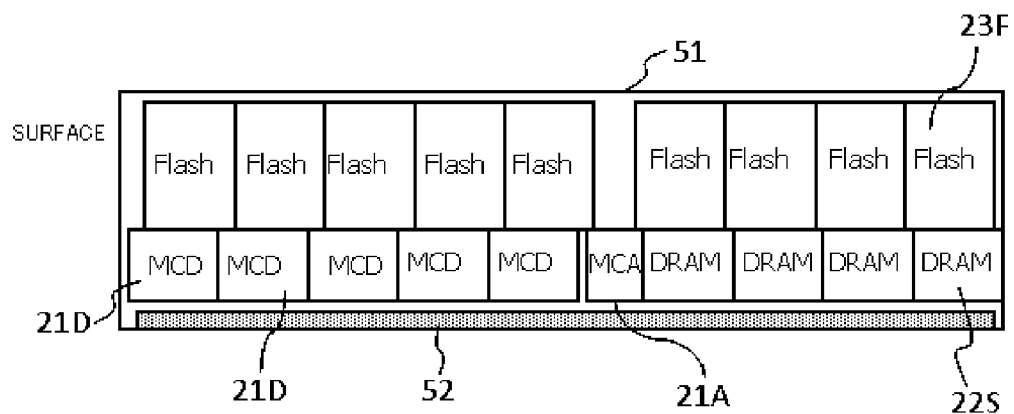
FIGS. 11A and 11B are diagrams illustrating a component arrangement of a consolidated memory module according to Modification 2.
Figure 11B:
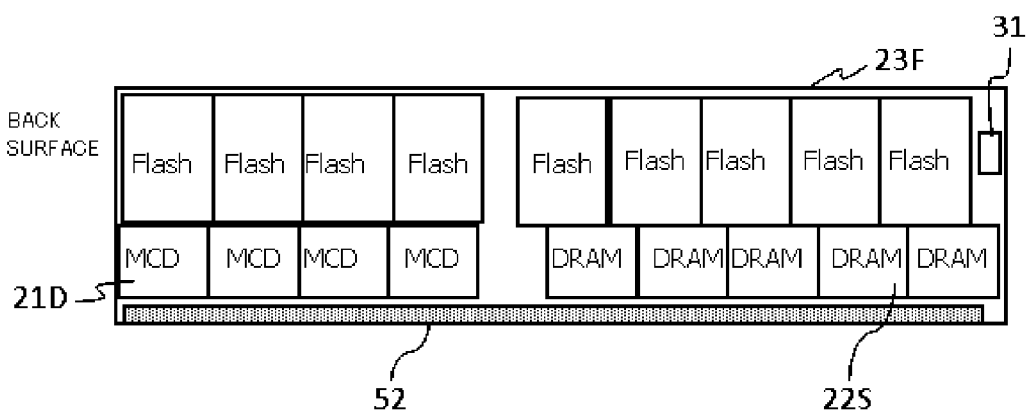

FIG. 11s are diagrams illustrating a component arrangement of a consolidated memory module according to Modification 2. FIG. 11A illustrates the surface of a consolidated memory module, while FIG. 11B illustrates the back surface of the consolidated memory module. A DIMM 50B according to Modification 2 includes five memory controllers 21D for data (MCD) on the left side of the memory controller 21A for address (MCA) and also four SDRAMs (DRAM) 22S on the right side of the memory controller 21A for address (MCA). The SDRAM (DRAM) 22S is arranged on the back side of each of the five memory controllers 21D for data (MCD), while the memory controller 21D for data (MCD) is arranged on the back side of each of the four SDRAMs (DRAM) 22S. The arrangement of the memory controller 21A for address (MCA), flash memories (Flash) 23F, an SPD 31, and a socket terminal 52 is the same as that of the memory module 50 according to the example. Even if the address terminals of the memory controllers 21D for data (MCD) are unevenly located on the right or left side, the wiring can easily be made between the memory controllers 21D for data (MCD) and the memory controller 21A for address (MCA), without preparing the memory controllers 21D for data (MCD) having a changed terminal position.

In FIG. 11s, five memory controllers 21D for data (MCD) and four SDRAMs (DRAM) 22S are arranged on the surface of the substrate. However, four memory controllers 21D for data (MCD) and five SDRAMs (DRAM) 22S may be arranged on the surface of the substrate.

<Modification 3>

Figure 12B:
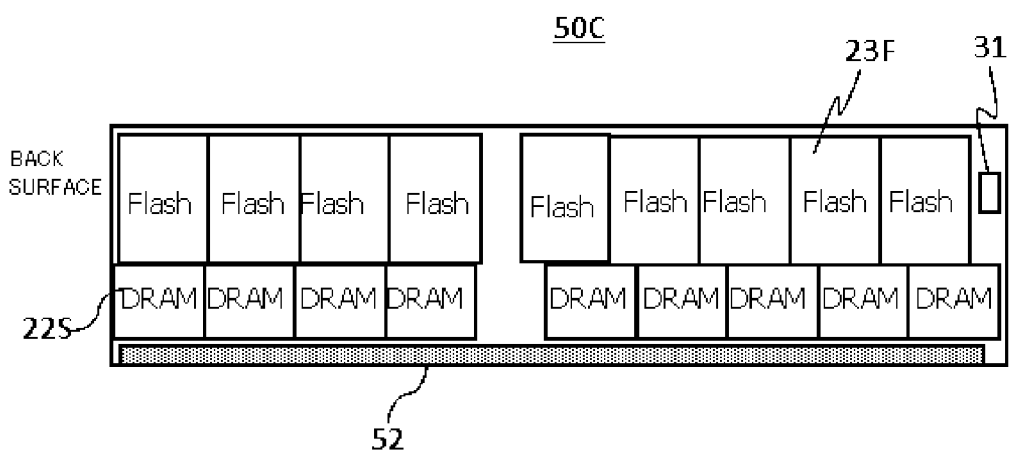

FIG. 12s are diagrams illustrating a component arrangement of a consolidated memory module according to Modification 3. FIG. 12A illustrates the surface of the consolidated memory module, while FIG. 12B illustrates the back surface of the consolidated memory module. In a DIMM 50C according to Modification 3, the number of mounted flash memories 23F (memory capacity of the flash memories) is one-half that of the consolidated memory module 50 according to the example. By forming the one-half number of the flash memories, it is possible to increase the number of mounted SDRAMs 22S (memory capacity of the SDRAMs). When the flash memories 23F are arranged only the back side of the substrate 51 it is possible to reduce the heat from the CPU as a heat source of a high temperature.

Accordingly, the inventions realized by the present inventors have particularly been described based on the preferred embodiment, the examples, and the modifications. However, needless to say, the present invention is not limited to the above-preferred embodiment, examples, and modifications, and various changes may possibly be made.

Some of the contents described in the example will be described below.

(1) The memory module to be accessed by the memory interface of the SDRAM has a plurality of SDRAMs, a plurality of NAND type flash memories, a plurality of first controllers connected to the SDRAMs and the NAND type flash memories, a second controller connected to the SDRAMs and the first controllers, and an SPD. The second controller controls to supply an address signal and a control signal to the SDRAMs. The second controller controls to supply a control signal to the first controllers. The first controllers control to supply a data signal to the SDRAMs. The first controllers control to supply a command and data to the NAND type flash memories. The data read from the NAND type flash memories is once stored in the SDRAMs, and the data is transferred from the SDRAMs to the memory bus, by the first controllers and the second controller.

(2) In the above-described memory module (1), the number of first controllers is the same as that of the SDRAMs, that is, nine. The number of second controller is one. The data width of each of the plurality of SDRAMs is 8 bits.

(3) In one of the above-described memory modules (1) and (2), the memory bus is formed of a data bus with a 64-bit width and an ECC data bus with an 8-bit width.

(4) In one of the above-described memory modules (1) and (2), the first memory is an SDRAM, while the second memory is a NAND type flash memory.

LIST OF REFERENCE SIGNS 3, 3FD Memory Module
9M Memory Bus
11 CPU
100 Information Processing Unit
B1 Memory Controller
B2 Second memory
B3 Third Memory
S1 First Memory

The invention claimed is:

1. An information processing device including:
a CPU;
a memory bus connected to the CPU; and
a first memory module and a second memory module connected to the memory bus and included in a main storage unit,
wherein the first memory module has a plurality of first memories,
the second memory module has a plurality of second memories with the same memory interface as that of the first memories, a plurality of third memories with a memory interface different from that of the first memories, and a first memory controller for address and a second memory controller for data which cooperate to control the second memories and the third memories,
the first memory module and the second memory module are accessed by the memory interface of the first memories,
data read from the third memories is stored at an address in the second memories assigned by an OS as an address space of the main storage unit, and the data is transferred from the second memories to the CPU through the memory bus by the first memory controller and the second memory controller, the first memory controller is configured to supply an address signal and a control signal to the second memories, and a control signal to the second memory controller, and the second memory controller is configured to supply a data signal to the second memories and a command and data to the third memories.

2. The information processing device according to claim 1, wherein a memory capacity of the second memory module is larger than a memory capacity of the first memory module.

3. The information processing device according to claim 2, wherein the third memories have a longer read time and a larger memory capacity than those of the second memories.

4. The information processing device according to claim 1, wherein the CPU has a third memory controller controlling the first memory module and the second memory module.

5. The information processing device according to claim 4, wherein the third controller is controlled by a hypervisor, and the hypervisor translates a memory address of a read destination of the third memories to an address of the second memories.

6. The information processing device according to claim 4, wherein the third controller controls to initialize the first memories.

7. The information processing device according to claim 4, wherein the third controller detects and corrects an error of data read from the first memory module and the second memory module.

8. The information processing device according to claim 4, wherein the third controller performs an alternative process (wear leveling) of a non-volatile memory.

9. The information processing device according to claim 1, wherein the memory bus includes a data bus of a 64-bit width and an ECC data bus of an 8-bit width.

10. The information processing device according to claim 1, wherein the second memories are SDRAMs, and the third memories are NAND type flash memories.

11. A memory module which is connected to a memory bus, including:

a plurality of first memories having a first read time and a first memory capacity;

a plurality of second memories having a second read time longer than the first read time and a second memory capacity larger than the first memory capacity;

a plurality of first controllers connected to the first memories and the second memories; and a second controller connected to the first memories and the first controllers, wherein the memory module is accessed by a memory interface of the first memories, the second controller controls to supply an address signal and a control signal to the first memories, the second controller controls to supply a control signal to the first controllers, the first controllers control to supply a data signal to the first memories, the first controllers control to supply a command and data to the second memories, and data read from the second memories is stored once in the first memories, and the data is transferred from the first memories to the memory bus, by the first controllers and the second controller.

12. The memory module according to claim 11, wherein number of the first controllers is equal to number of the first memories, and number of the second controller is one.

13. The memory module according to claim 12, wherein numbers of the first memories and the first controllers are respectively nine.

14. The memory module according to claim 11, wherein the second controller is arranged between the plurality of first controllers.

* * * * *